(12) United States Patent
Bertness

(10) Patent No.: US 6,331,762 B1
(45) Date of Patent: *Dec. 18, 2001

(54) ENERGY MANAGEMENT SYSTEM FOR AUTOMOTIVE VEHICLE

(75) Inventor: Kevin I. Bertness, Batavia, IL (US)

(73) Assignee: Midtronics, Inc., Willowbrook, IL (US)

(*) Notice: Subject to any disclaimer, the term of this patent is extended or adjusted under 35 U.S.C. 154(b) by 0 days.

This patent is subject to a terminal disclaimer.

(21) Appl. No.: 09/564,740

(22) Filed: May 4, 2000

Related U.S. Application Data

(63) Continuation-in-part of application No. 09/575,627, filed on May 22, 2000, and application No. 08/962,754, filed on Nov. 3, 1997, now Pat. No. 6,081,098, said application No. 09/575,627, is a continuation-in-part of application No. 08/962,754.

(60) Provisional application No. 60/175,762, filed on Jan. 12, 2000, provisional application No. 60/165,208, filed on Nov. 12, 1999, and provisional application No. 60/132,622, filed on May 5, 1999.

(51) Int. Cl.[7] .............................. C02J 7/14; G01N 27/416
(52) U.S. Cl. ........................ 320/134; 320/139; 324/430
(58) Field of Search ..................... 320/134, 139; 324/426, 430

(56) References Cited

U.S. PATENT DOCUMENTS

| | | | |
|---|---|---|---|
| 2,514,745 | 7/1950 | Dalzell | 171/95 |
| 3,356,936 | 12/1967 | Smith | 324/29.5 |
| 3,562,634 | 2/1971 | Latner | 31/4 |
| 3,593,099 | 7/1971 | Scholl | 320/13 |
| 3,607,673 | 9/1971 | Seyl | 204/1 |
| 3,676,770 | 7/1972 | Sharaf et al. | 324/29.5 |
| 3,729,989 | 5/1973 | Little | 73/133 |
| 3,753,094 | 8/1973 | Furuishi et al. | 324/29.5 |
| 3,808,522 | 4/1974 | Sharaf | 324/29.5 |

(List continued on next page.)

FOREIGN PATENT DOCUMENTS

| | | |
|---|---|---|
| 0 022 450 A1 | 1/1981 | (EP) . |
| 29 26 716 B1 | 1/1981 | (DE) . |
| 0 637 754 A1 | 2/1995 | (EP) . |
| 0 772 056 A1 | 5/1997 | (EP) . |
| 2 749 397 | 12/1997 | (FR) . |
| 2 088 159 A | 6/1982 | (GB) . |

(List continued on next page.)

OTHER PUBLICATIONS

U.S. application No. 09/280,133, Bertness, filed Mar. 26, 1999.

U.S. application No. 09/293,020, Troy, filed Apr. 16, 1999.

U.S. application No. 09/304,315, Bertness, filed May 3, 1999.

U.S. application No. 09/388,501, Champlin, filed Sep. 1, 1999.

(List continued on next page.)

*Primary Examiner*—Gregory J. Toatley, Jr.
(74) *Attorney, Agent, or Firm*—Westman, Champlin & Kelly, P.A.

(57) ABSTRACT

A battery monitor is provided for use with a battery of an automotive vehicle. The battery monitor can provide real time battery condition measurements and can selectively control the charging of the battery through an alternator of the vehicle based upon the measured battery condition.

299 Claims, 7 Drawing Sheets

U.S. PATENT DOCUMENTS

| | | | |
|---|---|---|---|
| 3,811,089 | 5/1974 | Strezelewicz | 324/170 |
| 3,873,911 | 3/1975 | Champlin | 324/29.5 |
| 3,876,931 * | 4/1975 | Godshalk | 324/429 |
| 3,886,443 | 5/1975 | Miyakawa et al. | 324/29.5 |
| 3,889,248 | 6/1975 | Ritter | 340/249 |
| 3,906,329 | 9/1975 | Bader | 320/44 |
| 3,909,708 | 9/1975 | Champlin | 324/29.5 |
| 3,936,744 | 2/1976 | Perlmutter | 324/158 |
| 3,946,299 | 3/1976 | Christianson et al. | 320/43 |
| 3,947,757 | 3/1976 | Grube et al. | 324/28 |
| 3,969,667 | 7/1976 | McWilliams | 324/29.5 |
| 3,979,664 | 9/1976 | Harris | 324/17 |
| 3,984,762 | 10/1976 | Dowgiallo, Jr. | 324/29.5 |
| 3,984,768 | 10/1976 | Staples | 324/62 |
| 3,989,544 | 11/1976 | Santo | 429/65 |
| 4,008,619 | 2/1977 | Alcaide et al. | 73/398 |
| 4,053,824 | 10/1977 | Dupuis et al. | 324/29.5 |
| 4,070,624 | 1/1978 | Taylor | 327/158 |
| 4,086,531 | 4/1978 | Bernier | 324/158 |
| 4,112,351 | 9/1978 | Back et al. | 324/16 |
| 4,114,083 | 9/1978 | Benham et al. | 320/39 |
| 4,126,874 | 11/1978 | Suzuki et al. | 354/60 |
| 4,178,546 | 12/1979 | Hulls et al. | 324/158 |
| 4,193,025 | 3/1980 | Frailing et al. | 324/427 |
| 4,207,611 | 6/1980 | Gordon | 364/580 |
| 4,217,645 | 8/1980 | Barry et al. | 364/483 |
| 4,315,204 | 2/1982 | Sievers et al. | 322/28 |
| 4,316,185 | 2/1982 | Watrous et al. | 340/636 |
| 4,322,685 | 3/1982 | Frailing et al. | 324/429 |
| 4,363,407 | 12/1982 | Barkler et al. | 209/3.3 |
| 4,369,407 | 1/1983 | Korbell | 324/416 |
| 4,379,990 | 4/1983 | Sievers et al. | 322/99 |
| 4,390,828 | 6/1983 | Converse et al. | 320/32 |
| 4,392,101 | 7/1983 | Saar et al. | 320/20 |
| 4,396,880 | 8/1983 | Windebank | 320/21 |
| 4,408,157 | 10/1983 | Beaubien | 324/62 |
| 4,412,169 | 10/1983 | Dell'Orto | 320/64 |
| 4,423,378 | 12/1983 | Marino et al. | 324/427 |
| 4,423,379 | 12/1983 | Jacobs et al. | 324/429 |
| 4,424,491 | 1/1984 | Bobbett et al. | 324/433 |
| 4,459,548 | 7/1984 | Lentz et al. | 324/158 |
| 4,514,694 | 4/1985 | Finger | 324/429 |
| 4,520,353 | 5/1985 | McAuliffe | 340/636 |
| 4,633,418 | 12/1986 | Bishop | 364/554 |
| 4,659,977 | 4/1987 | Kissel et al. | 320/64 |
| 4,667,279 | 5/1987 | Maier | 363/46 |
| 4,678,998 | 7/1987 | Muramatsu | 324/427 |
| 4,679,000 | 7/1987 | Clark | 324/428 |
| 4,697,134 | 9/1987 | Burkum et al. | 320/48 |
| 4,707,795 | 11/1987 | Alber et al. | 364/550 |
| 4,709,202 | 11/1987 | Koenck et al. | 320/43 |
| 4,710,861 | 12/1987 | Kanner | 363/46 |
| 4,719,428 | 1/1988 | Liebermann | 324/436 |
| 4,743,855 | 5/1988 | Randin et al. | 324/430 |
| 4,745,349 | 5/1988 | Palanisamy et al. | 320/22 |
| 4,816,768 | 3/1989 | Champlin | 324/428 |
| 4,820,966 | 4/1989 | Fridman | 320/32 |
| 4,825,170 | 4/1989 | Champlin | 324/436 |
| 4,849,700 | 7/1989 | Morioka et al. | 324/427 |
| 4,876,495 | 10/1989 | Palanisamy et al. | 320/18 |
| 4,881,038 | 11/1989 | Champlin | 324/426 |
| 4,912,416 | 3/1990 | Champlin | 324/430 |
| 4,913,116 | 4/1990 | Katogi et al. | 123/425 |
| 4,929,931 | 5/1990 | McCuen | 340/636 |
| 4,931,738 | 6/1990 | MacIntyre et al. | 324/435 |
| 4,937,528 | 6/1990 | Palanisamy | 324/430 |
| 4,947,124 | 8/1990 | Hauser | 324/430 |
| 4,956,597 | 9/1990 | Heavvvey et al. | 320/14 |
| 4,968,941 | 11/1990 | Rogers | 324/428 |
| 4,968,942 | 11/1990 | Palanisamy | 324/430 |
| 5,004,979 | 4/1991 | Marino et al. | 324/160 |
| 5,032,825 | 7/1991 | Xuznicki | 340/636 |
| 5,047,722 | 9/1991 | Wurst et al. | 324/430 |
| 5,087,881 | 2/1992 | Peacock | 324/378 |
| 5,126,675 | 6/1992 | Yang | 324/435 |
| 5,140,269 | 8/1992 | Champlin | 324/433 |
| 5,144,218 | 9/1992 | Bosscha | 320/44 |
| 5,144,248 | 9/1992 | Alexandres et al. | 324/428 |
| 5,160,881 | 11/1992 | Schramm et al. | 322/7 |
| 5,170,124 | 12/1992 | Blair et al. | 324/434 |
| 5,179,335 | 1/1993 | Nor | 320/21 |
| 5,204,611 | 4/1993 | Nor et al. | 320/21 |
| 5,214,370 | 5/1993 | Harm et al. | 320/35 |
| 5,214,385 | 5/1993 | Gabriel et al. | 324/434 |
| 5,241,275 | 8/1993 | Fang | 324/430 |
| 5,254,952 | 10/1993 | Salley et al. | 324/429 |
| 5,266,880 | 11/1993 | Newland | 320/14 |
| 5,281,919 | 1/1994 | Palanisamy | 324/427 |
| 5,281,920 | 1/1994 | Wurst | 324/430 |
| 5,295,078 | 3/1994 | Stich et al. | 364/483 |
| 5,298,797 | 3/1994 | Redl | 307/246 |
| 5,300,874 | 4/1994 | Shimamoto et al. | 320/15 |
| 5,302,902 | 4/1994 | Groehl | 324/434 |
| 5,315,287 | 5/1994 | Sol | 340/455 |
| 5,321,626 | 6/1994 | Palladino | 364/483 |
| 5,331,268 | 7/1994 | Patino et al. | 320/20 |
| 5,336,993 | 8/1994 | Thomas et al. | 324/158.1 |
| 5,338,515 | 8/1994 | Dalla Betta et al. | 422/95 |
| 5,339,018 | 8/1994 | Brokaw | 320/35 |
| 5,343,380 | 8/1994 | Champlin | 363/46 |
| 5,347,163 * | 9/1994 | Yoshimura | 307/66 |
| 5,352,968 | 10/1994 | Reni et al. | 320/35 |
| 5,365,160 | 11/1994 | Leppo et al. | 320/22 |
| 5,365,453 | 11/1994 | Startup et al. | 364/481 |
| 5,381,096 | 1/1995 | Hirzel | 324/427 |
| 5,412,323 | 5/1995 | Kato et al. | 324/429 |
| 5,426,371 | 6/1995 | Salley et al. | 324/429 |
| 5,426,416 | 6/1995 | Jefferies et al. | 340/664 |
| 5,432,426 | 7/1995 | Yoshida | 320/20 |
| 5,434,495 | 7/1995 | Toko | 320/44 |
| 5,442,274 | 8/1995 | Tamai | 320/23 |
| 5,449,996 | 9/1995 | Matsumoto et al. | 320/20 |
| 5,449,997 | 9/1995 | Gilmore et al. | 320/39 |
| 5,451,881 | 9/1995 | Finger | 324/433 |
| 5,457,377 | 10/1995 | Jonsson | 320/5 |
| 5,469,043 | 11/1995 | Cherng et al. | 320/31 |
| 5,485,090 | 1/1996 | Stephens | 324/433 |
| 5,488,300 | 1/1996 | Jamieson | 324/432 |
| 5,519,383 | 5/1996 | De La Rosa | 340/636 |
| 5,528,148 | 6/1996 | Rogers | 324/426 |
| 5,537,967 | 7/1996 | Tashiro et al. | 123/792.1 |
| 5,546,317 | 8/1996 | Andrieu | 364/481 |
| 5,548,273 | 8/1996 | Nicol et al. | 340/439 |
| 5,550,485 | 8/1996 | Falk | 324/772 |
| 5,561,380 | 10/1996 | Sway-Tin et al. | 324/509 |
| 5,562,501 | 10/1996 | Kinoshita et al. | 439/852 |
| 5,572,136 | 11/1996 | Champlin | 324/426 |
| 5,574,355 | 11/1996 | McShane et al. | 320/39 |
| 5,583,416 | 12/1996 | Klang | 320/22 |
| 5,585,728 | 12/1996 | Champlin | 324/427 |
| 5,589,757 | 12/1996 | Klang | 320/22 |
| 5,592,093 | 1/1997 | Klingbiel | 324/426 |
| 5,596,260 | 1/1997 | Moravec et al. | 320/30 |
| 5,598,098 | 1/1997 | Champlin | 324/430 |
| 5,602,462 | 2/1997 | Stich et al. | 323/258 |
| 5,606,242 | 2/1997 | Hull et al. | 320/48 |
| 5,621,298 | 4/1997 | Harvey | 320/5 |
| 5,642,031 | 6/1997 | Brotto | 320/21 |
| 5,650,937 | 7/1997 | Bounaga | 364/483 |
| 5,652,501 | 7/1997 | McClure et al. | 320/17 |
| 5,656,920 | 8/1997 | Cherng et al. | 320/31 |

| | | | |
|---|---|---|---|
| 5,675,234 | 10/1997 | Greene | 320/15 |
| 5,677,077 | 10/1997 | Faulk | 429/90 |
| 5,699,050 | 12/1997 | Kanazawa | 340/636 |
| 5,701,089 | 12/1997 | Perkins | 327/772 |
| 5,705,929 | 1/1998 | Caravello et al. | 324/430 |
| 5,710,503 | 1/1998 | Sideris et al. | 320/6 |
| 5,717,336 | 2/1998 | Basell et al. | 324/430 |
| 5,717,937 | 2/1998 | Fritz | 395/750.01 |
| 5,747,909 | 5/1998 | Syverson et al. | 310/156 |
| 5,757,192 | 5/1998 | McShane et al. | 324/427 |
| 5,760,587 | 6/1998 | Harvey | 324/434 |
| 5,773,978 | 6/1998 | Becker | 324/430 |
| 5,789,899 | 8/1998 | van Phuoc et al. | 320/30 |
| 5,793,359 | 8/1998 | Ushikubo | 345/169 |
| 5,808,469 | 9/1998 | Kopera | 324/43.4 |
| 5,821,756 | 10/1998 | McShane et al. | 324/430 |
| 5,825,174 | 10/1998 | Parker | 324/106 |
| 5,831,435 | 11/1998 | Troy | 324/426 |
| 5,862,515 | 1/1999 | Kobayashi et al. | 702/63 |
| 5,872,443 | 2/1999 | Williamson | 320/21 |
| 5,895,440 | 4/1999 | Proctor et al. | 702/63 |
| 5,914,605 | 6/1999 | Bertness | 324/430 |
| 5,929,609 | 7/1999 | Joy et al. | 322/25 |
| 5,939,855 | 8/1999 | Proctor et al. | 320/104 |
| 5,939,861 | 8/1999 | Joko et al. | 320/122 |
| 5,945,829 | 8/1999 | Bertness | 324/430 |
| 5,969,625 | 10/1999 | Russo | 340/636 |
| 6,002,238 | 12/1999 | Champlin | 320/134 |
| 6,008,652 | 12/1999 | Theofanopoulos et al. | 324/434 |
| 6,009,369 | 12/1999 | Boisvert et al. | 701/99 |
| 6,031,354 | 2/2000 | Wiley et al. | 320/116 |
| 6,037,751 | 3/2000 | Klang | 320/160 |
| 6,037,777 | 3/2000 | Champlin | 324/430 |
| 6,051,976 | 4/2000 | Bertness | 324/426 |
| 6,072,299 | 6/2000 | Kurie et al. | 320/112 |
| 6,072,300 | 6/2000 | Tsuji | 320/116 |
| 6,081,098 | 6/2000 | Bertness et al. | 320/134 |
| 6,091,245 | 7/2000 | Bertness | 324/426 |
| 6,094,033 | 7/2000 | Ding et al. | 320/132 |
| 6,104,167 | 8/2000 | Bertness et al. | 320/132 |
| 6,114,834 | 9/2000 | Parise | 320/109 |
| 6,137,269 | 10/2000 | Champlin | 320/150 |
| 6,150,793 | 11/2000 | Lesesky et al. | 320/104 |
| 6,163,156 | 12/2000 | Bertness | 324/426 |
| 6,172,483 | 1/2001 | Champlin | 320/134 |
| 6,172,505 | 1/2001 | Bertness | 324/430 |

FOREIGN PATENT DOCUMENTS

| | | |
|---|---|---|
| 59-17892 | 1/1984 | (JP) . |
| 59-17893 | 1/1984 | (JP) . |
| 59-17894 | 1/1984 | (JP) . |
| 59017894 | 1/1984 | (JP) . |
| 59215674 | 12/1984 | (JP) . |
| 60225078 | 11/1985 | (JP) . |
| 62-180284 | 8/1987 | (JP) . |
| 63027776 | 2/1988 | (JP) . |
| 03274479 | 12/1991 | (JP) . |
| 03282276 | 12/1991 | (JP) . |
| 4-8636 | 1/1992 | (JP) . |
| 04131779 | 5/1992 | (JP) . |
| 04372536 | 12/1992 | (JP) . |
| 5216550 | 8/1993 | (JP) . |
| 71-28414 | 5/1995 | (JP) . |
| WO 93/22666 | 11/1993 | (WO) . |
| WO 98/58270 | 12/1998 | (WO) . |
| WO 99/23738 | 5/1999 | (WO) . |

OTHER PUBLICATIONS

U.S. application No. 09/431,446, Bertness, filed Nov. 1, 1999.

U.S. application No. 09/483,623, Klang, filed Jan. 13, 2000.

U.S. application No. 09/544,696, Bertness et al., filed Apr. 7, 2000.

U.S. application No. 09/560,920, Bertness, filed Apr. 28, 2000.

"Electrochemical Impedance Spectroscopy in Battery Development and Testing", *Batteries International*, Apr. 1997, pp. 59 and 62–63.

"Battery Impedance", by E. Willihnganz et al., *Electrical Engineering*, Sep. 1959, pp. 922–925.

"Determining The End of Battery Life", by S. DeBardelaben, *IEEE*, 1986, pp. 365–368.

"A Look at the Impedance of a Cell", by S. Debardelaben, *IEEE*, 1988, pp. 394–397.

"The Impedance of Electrical Storage Cells", by N.A. Hampson et al., *Journal of Applied Electrochemistry*, 1980, pp. 3–11.

"A Package for Impedance/Admittance Data Analysis", by B. Boukamp, *Solid State Ionics*, 1986, pp. 136–140.

"Precision of Impedance Spectroscopy Estimates of Bulk, Reaction Rate, and Diffusion Parameters", by J. Macdonald et al., *J. Electroanal, Chem.*, 1991, pp. 1–11.

Internal Resistance: Harbinger of Capacity Loss in Starved Electrolyte Sealed Lead Acid Batteries, by Vaccaro, F.J. et al., *AT&T Bell Laboratories*, 1987 IEEE, Ch. 2477, pp. 128,131.

IEEE Recommended Practice For Maintenance, Testings, and Replacement of Large Lead Storage Batteries for Generating Stations and Substations, *The Institute of Electrical and Electronics Engineers, Inc.*, ANSI/IEEE Std. 450–1987, Mar. 9, 1987, pp. 7–15.

"Field and Laboratory Studies to Assess the State of Health of Valve–Regulated Lead Acid Batteries: Part I Conductance/Capacity Correlation Studies", by D. Feder et al., *IEEE*, Aug. 1992, pp. 218–233.

"Battery Impedance", by E. Willihnganz et al., *Electrical Engineering*, Sep. 1959, pp. 922–925.

"JIS Japanese Industrial Standard–Lead Acid Batteries for Automobiles", *Japanese Standards Association UDC*, 621.355.2:629.113.006, Nov. 1995.

"Performance of Dry Cells", by C. Hambuechen, Preprint of *Am. Electrochem. Soc.*, Apr. 18–20, 1912, paper No. 19, pp. 1–5.

"A Bridge for Measuring Storage Battery Resistance", by E. Willihncanz, *The Electrochemical Society*, preprint 79–20, Apr. 1941, pp. 253–258.

\* cited by examiner

FIG. 2

ENERGY MANAGEMENT SYSTEM FOR AUTOMOTIVE VEHICLE

The present invention is a Continuation-In-Part of application Ser. No. 08/962,754, filed Nov. 3, 1997, now U.S. Pat. No. 6,081,098 and also a Continuation-In-Part of application Ser. No. 09/575,627, filed May 22, 2000, which is a Continuation-In-Part of application Ser. No. 08/962,754, filed Nov. 3, 1997, now U.S. Pat. No. 6,081,098 and also claims priority to Provisional Application Serial No. 60/132,622, filed May 5, 1999, and entitled AUTOMOTIVE VEHICLE BATTERY CHARGING SYSTEM; U.S. Provisional Application No. 60/165,208, filed Nov. 12, 1999, and entitled ENERGY MANAGEMENT SYSTEM FOR AUTOMOTIVE VEHICLE; and Provisional Application Serial No. 60/175,762, filed Jan. 12, 2000, and entitled ENERGY MANAGEMENT SYSTEM FOR AUTOMOTIVE VEHICLE, which are incorporated herein by reference in their entirety.

BACKGROUND OF THE INVENTION

The present invention relates to automotive vehicles. More specifically, the present invention relates to an energy management and monitor system for a battery of an automotive vehicle.

Automotive vehicles powered by combustion engines typically include a battery. The battery is used to power the electrical system when the engine is not running. Additionally, the engine is used to charge the battery. The engine is also used to power electrical components of the vehicle when the engine is running.

Vehicles contain charging systems, simply referred to as an "alternator," which are powered by the engine and used to charge the battery. Typical prior art charging systems have been a simple voltage regulator connected to the output of an alternator. The voltage regulator is used to set a voltage generated by the alternator which is applied to the battery. However, this simple technique does not take into account the actual condition of the battery as the voltage across the battery is not an accurate representation of the battery's condition. Additionally, such systems do not provide any information about the use of the battery, or the battery's current state of charge or state of health.

SUMMARY OF THE INVENTION

Various aspects of the present invention provide a method and/or an apparatus for monitoring or controlling charging of a battery in a vehicle. In one aspect, a method is provided for charging a battery in a vehicle having an internal combustion engine configured to drive an alternator electrically coupled to the battery and adapted to charge the battery with a charge signal applied to the battery. The method includes coupling to the battery through a four point Kelvin connection, measuring a dynamic parameter of the battery using the Kelvin connection, where the dynamic parameter measurement a function of a time varying signal. A condition of the battery as a function of the measured dynamic parameter. The charge signal from the alternator is controlled in response to the determined condition of the battery.

In another aspect, an apparatus for monitoring the condition of a storage battery while the storage battery is coupled in parallel to an electrical system of an operating vehicle is provided. The apparatus includes a first electrical connection directly coupled to a positive terminal of the battery, a second electrical connection directly coupled to a negative terminal of the battery, and the first and second electrical connections are coupled to a voltage sensor to measure a time varying voltage across the battery. A third electrical connection is directly coupled to the positive terminal of the battery and a fourth electrical connection directly is coupled to a negative terminal of the battery, the third and fourth electrical connections are coupled to a forcing function having a time varying component. In one aspect, a current sensor is provided which is electrically in series with the battery. A microprocessor is configured to determine the condition of the battery as a function of a dynamic parameter of the battery based upon the measured voltage and the forcing function.

BRIEF DESCRIPTION OF THE DRAWINGS

FIG. 2 is a more detailed schematic diagram showing the battery monitor of FIG. 1.

DETAILED DESCRIPTION OF THE ILLUSTRATIVE EMBODIMENTS

The present invention offers an apparatus and method for monitoring the condition of the battery and controlling charging of the battery. Such a method and apparatus can be part of a general energy management system for a vehicle.

Figure 1:
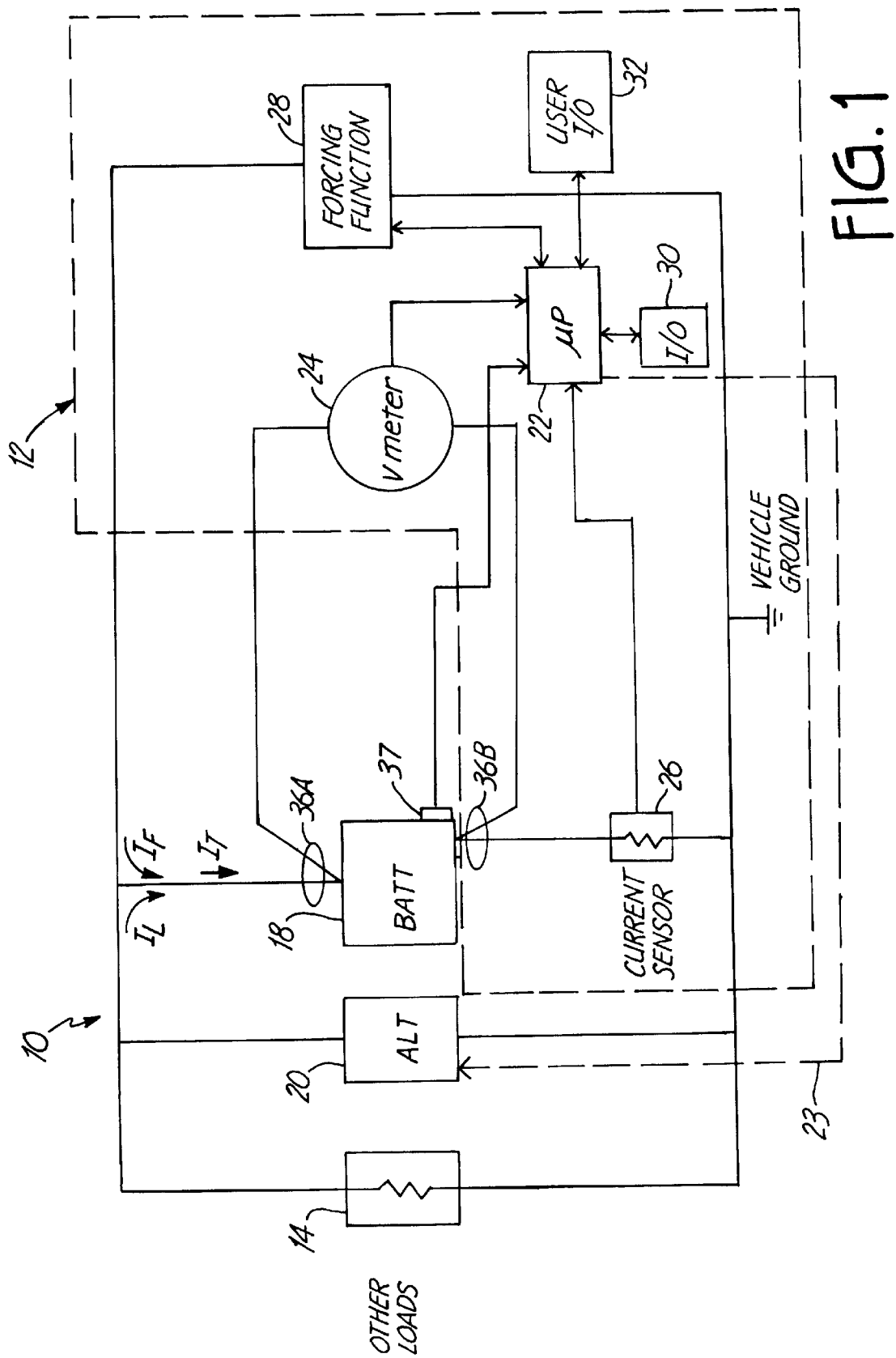
FIG. 1 is a simplified block diagram showing a battery monitor in a vehicle in accordance with one embodiment of the present invention.

FIG. 1 is a simplified block diagram showing an automotive vehicle 10 which includes a battery monitor 12 in accordance with one embodiment of the present invention. Vehicle 10 includes vehicle loads 14 which are shown schematically as an electrical resistance. A battery 18 is coupled to the vehicle load 14 and to an alternator 20. Alternator 20 couples to an engine of the vehicle 10 and is used to charge battery 18 and provide power to loads 14 during operation.

In general, automotive vehicles include electrical systems which can be powered when the engine of the vehicle is operating by a generator, or alternator. However, when the engine is not running, a battery in the vehicle is typically used to power the system. Thus, the standard generator system in a vehicle serves two purposes. The generator is used to supply power to the vehicle loads, such as lights, computers, radios, defrosters and other electrical accessories. Further, the generator is used to recharge the battery such that the battery can be used to start the vehicle and such that the battery may power the electrical accessories when the engine is not running.

A standard generator system typically consists of a three phase AC alternator coupled to the engine by a belt or a shaft, rectification diodes and a voltage regulator. These components may exist separately or be part of an integral unit and are typically, somewhat inaccurately, referred to as an "alternator". The voltage regulator is configured such that a constant voltage is supplied by the charging system, regardless of the current being drawn by the electrical system. The actual load applied to the generator system varies depending upon the number of accessories that are activated and the current required to recharge the battery. Typical values for the voltage regulator output are between 13.5 and 15.5 volts, depending upon the vehicle manufacturer and particular battery chemistry. Further, the voltage on a specific vehicle can also be compensated for ambient temperature.

This prior art approach has a number of draw backs. The output voltage of the generator must be selected to be high enough to rapidly charge the battery under any condition and regardless of the state of charge of the battery. Electrical loads on the vehicle are designed to operate at 12.6 volts, the voltage provided by the battery when the engine is switched off. However, these electrical loads must also operate at the higher voltage supplied when the generator system is on. This higher voltage which is impressed upon the electrical system causes higher $I^2R$ (resistive) losses in the loads due to the increased voltage level. This wastes energy and causes the components to heat. This results in reduced life of the electrical circuitry, higher operating temperatures and wasted energy which must ultimately come from the primary fuel source used to operate the engine.

The high voltage across the battery is necessary when the battery's state of charge is low in order to rapidly recharge the battery. However, when the battery's state of charge is within an acceptable range (which occurs most of the time at normal driving speeds), the high voltage across the battery results in high $I^2R$ (resistive heating) losses within the battery resulting in waste of energy, heating of the battery causing premature battery failure, gassing of the battery also resulting in premature failure and heating of electrical components causing premature component failure.

One aspect of the present invention includes the recognition of the aforementioned problems associated with prior art battery charging techniques. In one aspect of the present invention, a battery charging system controller is provided which monitors the condition of the battery under charge and controls the charging system in response to the condition of the battery. With such general aspects of the invention, the particular implementation of the battery monitor and charge control can be selected as appropriate.

In the embodiment illustrated in FIG. 1, battery monitor 12 includes a microprocessor 22 coupled to a voltage sensor 24, a current sensor 26 and a forcing function 28. Microprocessor 22 may also include one or more inputs and outputs illustrated as I/O 30 adapted to couple to an external databus or to an internal databus associated with the vehicle 10. Further, a user input/output (I/O) 32 is provided for providing interaction with a vehicle operator. In one embodiment, microprocessor 22 is coupled to alternator 20 to provide a control output 23 to alternator 20 in response to inputs, alone or in various functional combinations, from current sensor 26, voltage sensor 24 and forcing function 28. In one embodiment, the control output 23 is configured to control alternator 20 such that a nominal voltage output from alternator 20 is 12.6 volts, typical of the nominal open-circuit voltage of the battery 18. Further, microprocessor 22 can raise the output voltage from alternator 20 in accordance with an inverse relationship to the state of charge of battery 18. This can be configured such that alternator 20 only charges battery 18 when necessary, and only charges battery 18 as much as is necessary. This charging technique can increase battery life, lower component temperature of loads 14, increase the lifespan of loads 14 and save fuel. This configuration provides a feedback mechanism in which the state of charge of battery 18 is used to control the charging of battery 18. The battery monitor 12 is easily installed in a vehicle electrical system. A single shunt current sensor 26 must be inserted in one of the primary battery cables and a control line provided to allow control of alternator 20. The control can be by simply adjusting the voltage supplied to a voltage regulator of alternator 20 to thereby control charging of battery 18. The battery monitor 12 can be a separate, self-sufficient and self-contained monitor which operates without requiring interaction with other components of the vehicle, except in some embodiment, alternator 20.

FIG. 1 also illustrates a Kelvin connection formed by connections 36A and 36B to battery 18. With such a Kelvin connection, two couplings are provided to the positive and negative terminals of battery 18. This allows one of the electrical connections on each side of the battery to carry large amounts of current while the other pair of connections can be used to obtain accurate voltage readings. Because substantially no current is flowing through the voltage sensor 24, there will be little voltage drop through the electrical connection between sensor 24 and battery 18 thereby providing more accurate voltage measurements. In various embodiments, the forcing function 28 can be located physically proximate battery 18 or be connected directly to battery 18. In other embodiments, the forcing function 28 is located anywhere within the electrical system of vehicle 10. In one aspect, the present invention includes an in-vehicle battery monitor 12 which couples to battery 18 through a Kelvin connection and further may optionally include a current sensor 26 and may be capable of monitoring battery condition while the engine of vehicle 12 is operated, loads 14 are turned on and/or alternator 20 is providing a charge signal output to charge battery 18. In one particular embodiment, the combination of the Kelvin connection formed by connections 36A and 36B along with a separate current sensor 26 connected in series with the electrical system of the vehicle 10 is provided and allows monitoring of the condition of battery 18 during operation of vehicle 10. The use of an current sensor 26 is used to provide a monitor of the total current $I_T$ flowing through battery 18.

In operation, microprocessor 22 is capable of measuring a dynamic parameter of battery 18. As used herein, a dynamic parameter includes any parameter of battery 18 which is measured as a function of a signal having an AC or transient component. Examples of dynamic parameters include dynamic resistance, conductance, admittance, impedance or their combinations. In various aspects of the invention, this measurement can be correlated, either alone or in combination with other measurements or inputs received by microprocessor 22, to the condition or status of battery 18. This correlation can be through testing of various batteries and may be through the use of a lookup table or a functional relationship such as a characterization curve. The relationship can also be adjusted based upon battery construction, type, size or other parameters of battery 18. Examples of various testing techniques are described in the following references which are incorporated herein by reference U.S. Pat. No. 3,873,911, issued Mar. 25, 1975, to Champlin, entitled ELECTRONIC BATTERY TESTING DEVICE; U.S. Pat. No. 3,909,708, issued Sep. 30, 1975, to Champlin, entitled ELECTRONIC BATTERY TESTING DEVICE; U.S. Pat. No. 4,816,768, issued Mar. 28, 1989, to Champlin, entitled ELECTRONIC BATTERY TESTING DEVICE; U.S. Pat. No. 4,825,170, issued Apr. 25, 1989, to Champlin, entitled ELECTRONIC BATTERY TESTING DEVICE WITH AUTOMATIC VOLTAGE SCALING; U.S. Pat. No. 4,881,038, issued Nov. 14, 1989, to Champlin, entitled ELECTRONIC BATTERY TESTING DEVICE WITH AUTOMATIC VOLTAGE SCALING TO DETERMINE DYNAMIC CONDUCTANCE; U.S. Pat. No. 4,912,416, issued Mar. 27, 1990, to Champlin, entitled ELECTRONIC BATTERY TESTING DEVICE WITH STATE-OF-CHARGE COMPENSATION; U.S. Pat. No. 5,140,269, issued Aug. 18, 1992, to Champlin, entitled ELECTRONIC TESTER FOR ASSESSING BATTERY/CELL CAPACITY; U.S. Pat. No. 5,343,380, issued Aug. 30, 1994, entitled METHOD AND APPARATUS FOR SUPPRESSING TIME VARYING SIGNALS IN BATTERIES UNDERGOING CHARGING OR DISCHARGING; U.S. Pat. No. 5,572,136, issued Nov. 5, 1996, entitled ELECTRONIC BATTERY TESTER WITH AUTOMATIC COMPENSATION FOR LOW STATE-OF-CHARGE; U.S. Pat. No. 5,574,355, issued Nov. 12, 1996, entitled METHOD AND APPARATUS FOR DETECTION AND CONTROL OF THERMAL RUNAWAY IN A BATTERY UNDER CHARGE; U.S. Pat. No. 5,585,728, issued Dec. 17, 1996, entitled ELECTRONIC BATTERY TESTER WITH AUTOMATIC COMPENSATION FOR LOW STATE-OF-CHARGE; U.S. Pat. No. 5,592,093, issued Jan. 7, 1997, entitled ELECTRONIC BATTERY TESTING DEVICE LOOSE TERMINAL CONNECTION DETECTION VIA A COMPARISON CIRCUIT; U.S. Pat. No. 5,598,098, issued Jan. 28, 1997, entitled ELECTRONIC BATTERY TESTER WITH VERY HIGH NOISE IMMUNITY; U.S. Pat. No. 5,757,192, issued May 26, 1998, entitled METHOD AND APPARATUS FOR DETECTING A BAD CELL IN A STORAGE BATTERY; U.S. Pat. No. 5,821,756, issued Oct. 13, 1998, entitled ELECTRONIC BATTERY TESTER WITH TAILORED COMPENSATION FOR LOW STATE-OF-CHARGE; U.S. Pat. No. 5,831,435, issued Nov. 3, 1998, entitled BATTERY TESTER FOR JIS STANDARD; U.S. Pat. No. 5,914,605, issued Jun. 22, 1999, entitled ELECTRONIC BATTERY TESTER; U.S. Pat. No. 5,945,829, issued Aug. 31, 1999, entitled MIDPOINT BATTERY MONITORING; U.S. Pat. No. 6,002,238, issued Dec. 14, 1999, entitled METHOD AND APPARATUS FOR MEASURING COMPLEX IMPEDANCE OF CELLS AND BATTERIES; U.S. Pat. No. 6,037,777, issued Mar. 14, 2000, entitled METHOD AND APPARATUS FOR DETERMINING BATTERY PROPERTIES FROM COMPLEX IMPEDANCE/ADMITTANCE; and U.S. Pat. No. 6,051,976, issued Apr. 18, 2000, entitled METHOD AND APPARATUS FOR AUDITING A BATTERY TEST.

In the specific embodiment illustrated in FIG. 1, the forcing function is a function which applies a signal having an AC or transient component to battery 18. The forcing function can be through the application of a load which provides a desired forcing function in which current is drawn from battery 18, or can be through active circuitry in which a current is injected into battery 18. This results in a current labeled $I_F$ in FIG. 1. The total current, $I_T$ through battery 18 is due to both the forcing function current $I_F$ and the current flowing through loads 14, $I_L$. Current sensor 26 is positioned to sense the total current $I_L$. One example battery dynamic parameter, the dynamic conductance (or reciprocally the battery resistance) can be calculated as:

$$\Delta G = V = \Delta I_{T/\Delta V} \qquad \text{EQ. 1}$$

where $\Delta V$ is the change in voltage measured across the battery 18 by voltage sensor 24 and $\Delta I_T$ is the change in total current measured flowing through battery 18 using current sensor 26. Note that Equation 1 uses current and voltage differences. In one embodiment, the change in voltage and change in current are measured over a period of 12.5 seconds and at a rate of 50 msec to thereby provide a total of 20 readings for $\Delta V$ and $\Delta I_T$ every second. The forcing function 28 is provided in order to ensure that the current through battery 18 changes with time. However, in one embodiment, changes in $I_L$ due to loads 14 or the output from alternator 20 can be used alone such that $\Delta I_T = \Delta I_L$ and the forcing function 28 is not required.

In one embodiment, the voltage and current sensors provide synchronized operation, within one microsecond, and are substantially immune to measurement errors due to network propagation delays or signal line inductance. Furthermore, microprocessor 22 can detect a failure of the voltage regulator and alternator 20 if the voltage output exceeds or drops below predetermined threshold levels. This information can be provided to an operator through user interface 32, for example, a "service regulator soon" indication.

A temperature sensor 37 is provided which can be coupled directly to one of the terminals of the battery 18 for measuring battery temperature. The temperature sensor 37 can be used in determining the condition of the battery, as battery condition is a function of temperature and can be used in estimating the amount of power which will be required to start the engine of the vehicle. Any type of temperature sensor can be used, for example, a thermistor, thermocouple, RTD, semiconductor or other temperature sensor.

In one embodiment, current sensor 26 comprises a resistance shunt of 250 μohms and current through the shunt is determined by measuring the voltage drop across the shunt. However, other types of current measurement techniques can also be used such as Hall Effect sensors or through an inductance probe. The change of voltage across the battery and the resultant change in current through the battery is sampled using, for example, one or more analog to digital converters. This information can be correlated to determine the total capacity, such as the total Cold Cranking Amp (CCA) capacity of the battery.

Note that during the measurement cycle, vehicle loads 14 may be applied unexpectedly causing noise to be present in the measurements. One technique which might be considered to reduce the noise is to discard those samples which are outside of a predetermined or adjustable window or are outside of the dynamic range of the analog to digital converter. However, quite unexpectedly it has been found that the accuracy of measurements can be increased by increasing the dynamic range of the analog to digital converters, at the expense of the accuracy of the samples obtained from the converter. By averaging all of the samples, even those which are statistically large or small relative to other samples, the present invention is capable of providing accurate voltage and current measurements even in a noisy environment. By averaging samples, and providing sufficient dynamic range for the analog to digital converter, no samples will be discarded and errors in the measurements will tend to cancel against other errors.

In general, the present invention uses the direct relationship between the dynamic conductance of the battery and the condition of the battery. For example, if a battery drops more than 15% below its rated capacity, microprocessor 22 can provide an output which indicates that the battery 18 should be replaced. Further, the conductance can be used to determine the charge level of the battery. Such a measurement can be augmented to improve accuracy by monitoring the total current flowing into battery 18, or out of battery 18, using current sensor 26. The voltage across the battery 18 can also be used to determine the charge used in the determination of charge level. In general, the state of charge can be determined as a function of various combinations either alone or together of battery state of health, temperature, charge balance (charge going into and out of the battery), charging efficiency and initial conditions such as the battery construction, manufacture, plate configuration or other conditions of the battery. The functional relationship can be determined by characterizing multiple batteries or through the use of artificial intelligence techniques such as neural networks.

Figure 2:
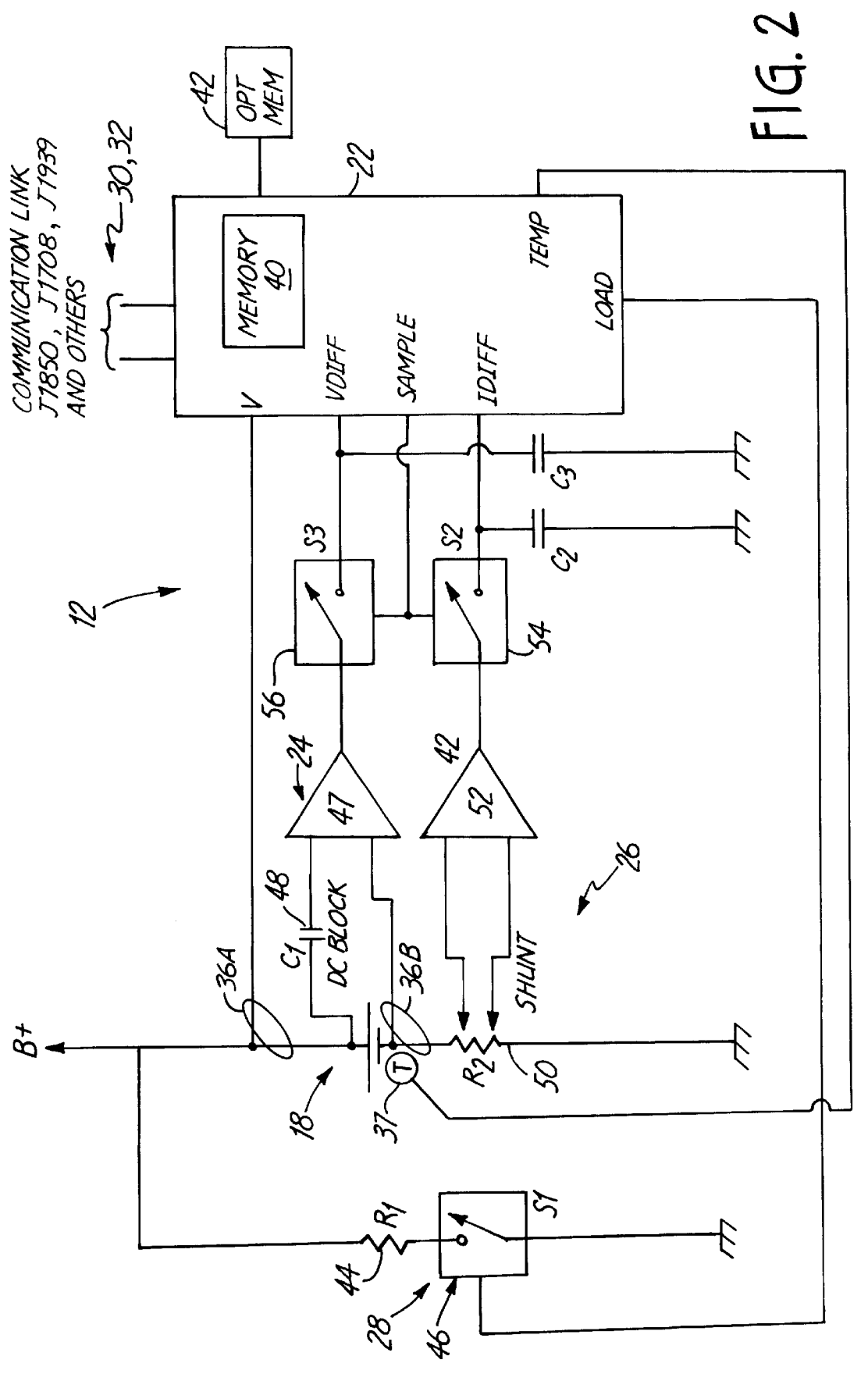

FIG. 2 is a more detailed schematic diagram of battery monitor 12. FIG. 2 shows microprocessor 22 which includes a memory 40. FIG. 2 illustrates I/O 32 with which can be, for specific examples, a communication link in accordance with various standards such as J1850, J1708, J1939, etc. Memory 40 is shown as an internal memory. However, external memory or an optional external memory 42 can also be provided. In general, memory is provided for storing programming functions, ratings, variables, etc. Microprocessor 22 can be a microcontroller or any type of digital circuitry and is not limited specifically to a microprocessor. FIG. 2 illustrates forcing function 28 in greater detail and includes a resistance $R_1$ 44 and a switch $S_1$ 46 controlled by microprocessor 22. Switch 46 can be, for example, a field effect transistor. Voltage sensor 24 is shown as including a differential amplifier 47 coupled to battery 18 through a DC blocking capacitor $C_1$ 48. Shunt 26 is illustrated as a resistance $R_2$ 50 and a differential amplifier 52. Switches $S_2$ 54 and $S_3$ 56 are positioned to selectively couple amplifiers 52 and 47, respectively, to microprocessor 22 and are actuated by a sample control line to provide data samples to microprocessor 22. An analog to digital converter can be an integral part of microprocessor 22 or it can be a separate component to digitize the outputs from amplifiers 47 and 52. Capacitors $C_2$ and $C_3$ provide sample and hold circuits.

Forcing function 28 can be formed by resistance as illustrated in FIG. 2, or by a current sink or through an existing load of the vehicle. Switch $S_1$ 46 can be an FET, or biopolar transistor or can be a mechanical or existing switch in the automotive vehicle. Although shunt 26 is illustrated with a shunt resistance, other types of current sensors such as Hall effect sensors or cable resistance based sensors can be used. Other types of DC blocking techniques can be used to replace capacitancy $C_1$ 48 such as a DC coupled amplifier.

Figure 3:
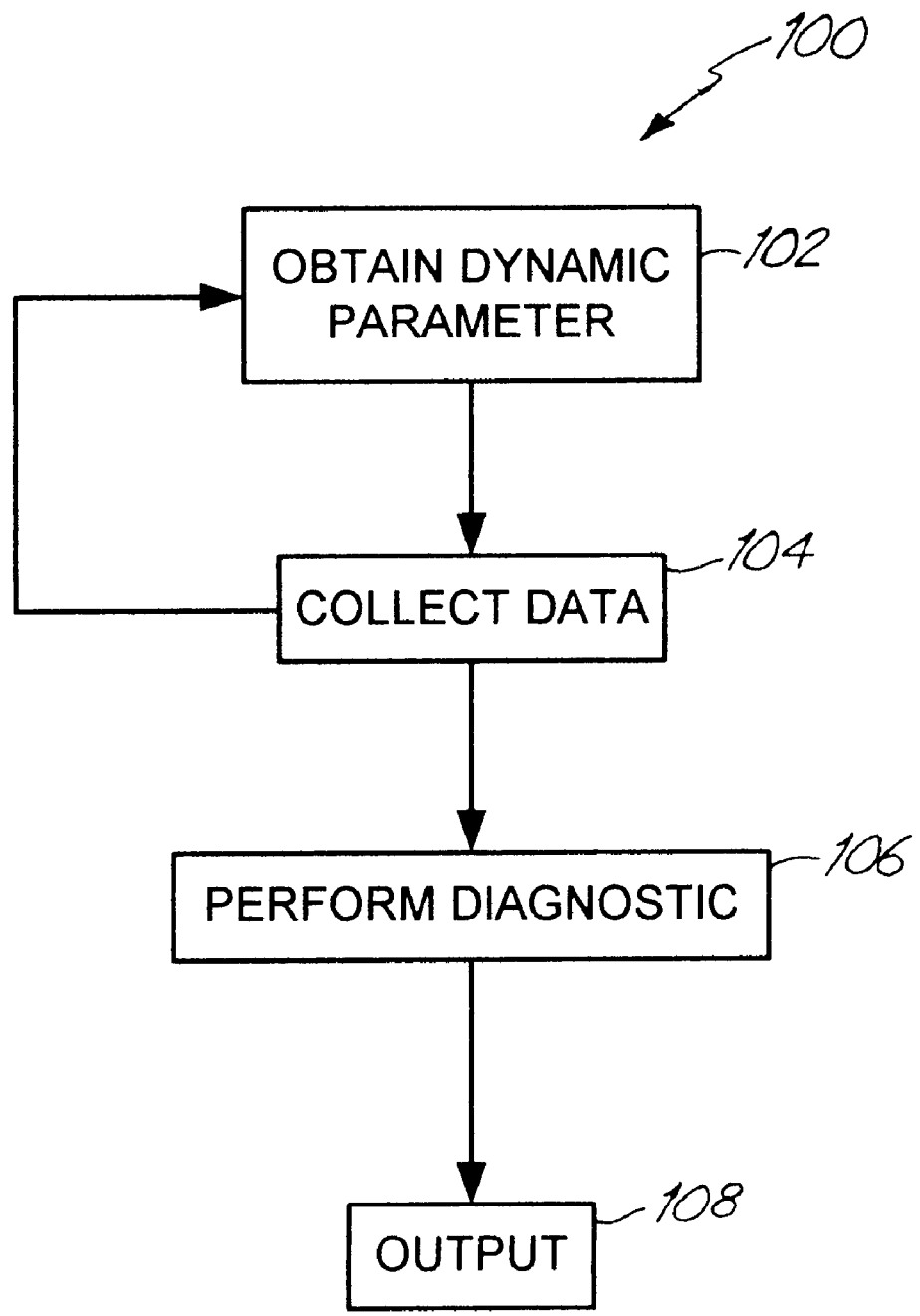
FIG. 3 is a simplified block diagram showing steps in performing diagnostics in accordance with one aspect of the present invention.

FIG. 3 is a simplified block diagram 100 showing diagnostic steps performed by microprocessor 28 in accordance with the invention. At blocks 102 and 104, the dynamic parameter(s) for the battery 18 are obtained and at block 104 data is collected. The type of data collected at block 104 can be any type of data used in determining the condition of the battery. For example, the data can be values used for $\Delta V$ and $\Delta I_T$, information related to the type of battery, etc. This information can be stored in memory 40 for subsequent retrieval by microprocessor 22. The data can be collected over any time period and during any type of engine or battery operation. At block 106, microprocessor 22 performs diagnostics based upon the data stored in memory 40. If a battery fault or impending fault is detected, an output can be provided at block 108 such as providing a "service battery soon" indication on the dash of the vehicle 10.

Various aspects of the invention include the particular diagnostics performed by diagnostic block 106. The diagnostics can be simple diagnostics such as a simple if-then rule in which the collected data is compared to various thresholds to provide the diagnostic output. Absolute values of the data can be used for this comparison or various statistical operations can be performed on the data for use in the comparison. For example, averages or standard deviation of the data can be compared to a threshold. The threshold levels can be determined through testing of the vehicle and entered into memory 40 during manufacture. Preferably, when battery 18 is replaced, the thresholds are updated accordingly.

In more advanced embodiments of the diagnostic block 106, microprocessor 22 can perform diagnostics using fuzzy logic, neural networks or artificial intelligence techniques. Neural networks can advantageously be used as they do not require that the battery, alternator and vehicle loads be modeled. Instead, neural networks are capable of learning what "normal" data collected at step 104 should be, and can provide an indication when a pattern of the data is drifting outside of normal operation. Further, the neural network can be "trained" to recognize potential sources of the failure and provide an expected time until the system completely fails. These diagnostic techniques can be selected and implemented such that the operator is warned of an impending failure, prior to the complete failure of the battery 18 or alternator 20.

Figure 4:
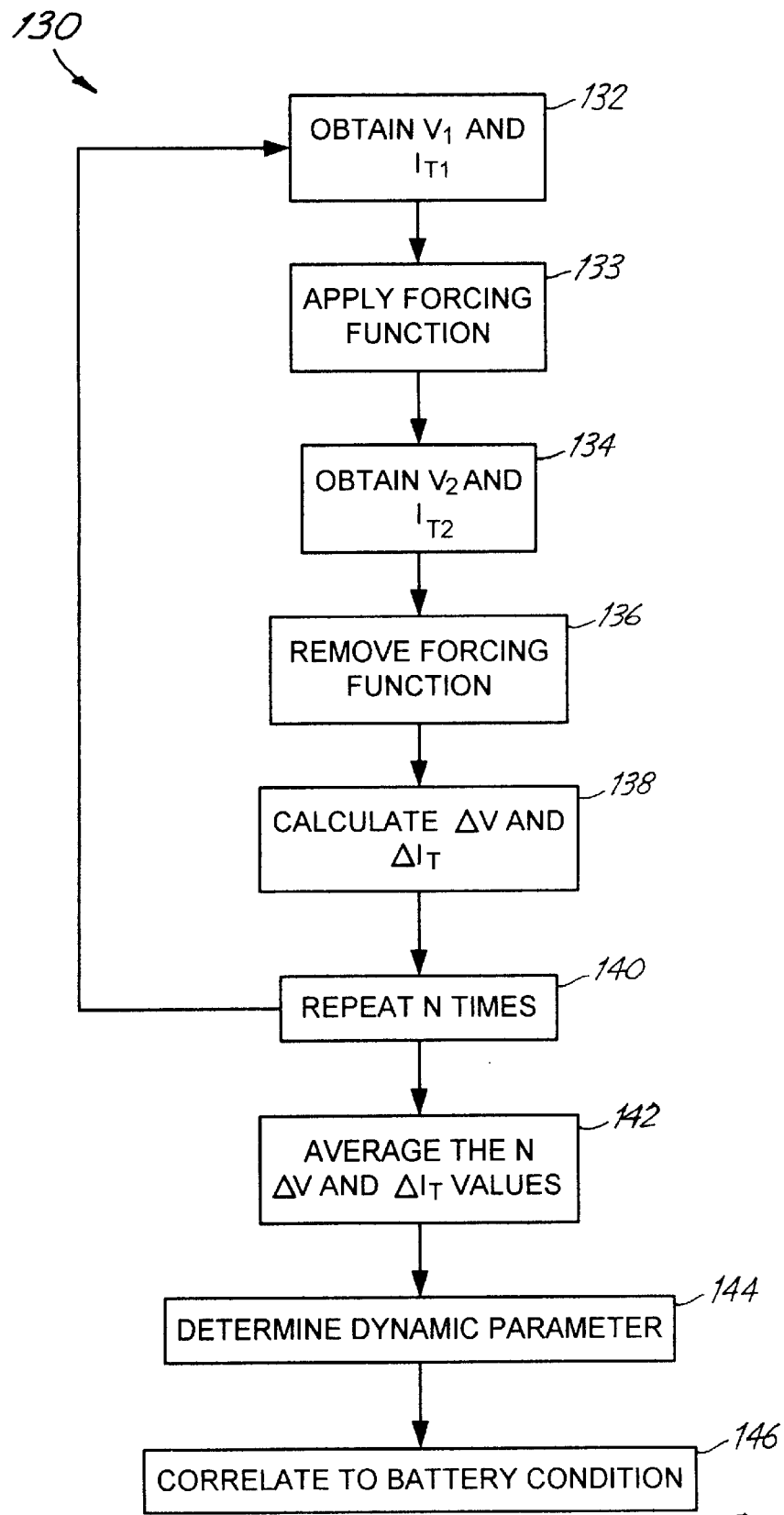
FIG. 4 is a simplified block diagram showing steps in collecting data for use with the present invention.

FIG. 4 is a block diagram 130 showing example steps in accordance with data collection and calculation of a dynamic parameter in accordance with the present invention. Of course, as should be pointed out with respect to all of the flow charts set forth herein, those skilled in the art will recognize that the particular functions of the blocks and the order in which the blocks are executed can be easily rearranged and the invention is not limited to the specific embodiments set forth herein.

In block diagram 130, at block 132 microprocessor 22 obtains an initial voltage $V_1$ across battery 18 using voltage sensor 24 and an initial current $I_{T1}$ through battery 18 using current sensor 26. Next, the forcing function 28 is applied to battery 18 at step 133. At block 134, microprocessor 22 obtains values $V_2$ and $I_{T2}$ with the forcing function applied, and at step 136 the forcing function is removed. Values for $\Delta V$ and $\Delta I_T$ are calculated at step 138. In one example embodiment, the forcing function is applied for a duration of 100 $\mu$Sec 20 times every second. N values are obtained at block 140. In one example, N is equal to 256. At block 142, the average of $\Delta V$ and $I_{T2}$ for the N samples is calculated and a dynamic parameter for the batter 18 is determined at block 144. This dynamic parameter can be correlated to a condition of the battery at block 146 and displayed on user I/O 32, output through I/O 30 or used to control alternator 20 through alternator control 23.

In one aspect of the invention, the battery monitor performs a state of charge measurement, in real time and regardless of battery polarization, and automatically corrects for the state of health of the battery and the battery temperature. In general, state of health can be determined as a function of the battery conductance and the open circuit voltage across battery 18. For example, the state of health can be determined as:

$$SOH=k_1(G|RATING)*f(V_{oc})-k_2 \qquad \text{EQ. 2}$$

where $k_1$ and $k_2$ are constants which are related to the type of battery, G is the measured conductance of the battery, rating is a rating for the battery and $f(V_{oc})$ is a relationship between the state of charge and the open circuit voltage of the battery as set forth in the aforementioned Champlin and Midtronics, Inc. patents. The state of health will range between 0 and 100%. Using the state of health determined by Equation 2, the state of charge (from 0 to 100%) can be determined in accordance with Equation 3:

$$SOCt_2 = 100 * \frac{\left[\int_{t_1}^{t_2} i\, dt \int_{t_1}^{t_2} e(T)dt \int_{t_1}^{t_2} e(i)dt\right]}{(SOH)(AMP-HOURCAPACITY)} + SOC_{t_1} \quad \text{EQ. 3}$$

where $t_1$ is the time at which the state of charge is known (i.e., from the period of overcharge, for example), $t_2$ is the present time, i is the current (amps) in or out of the battery at time t, T is the battery temperature, e(T) is the charge acceptance efficiency at temperature T, and e(i) is the charge acceptance efficiency at current i. Of course, Equations 2 and 3 are simply examples of state of health and state of charge measurements and other techniques can be used in accordance with the invention.

Figure 5:
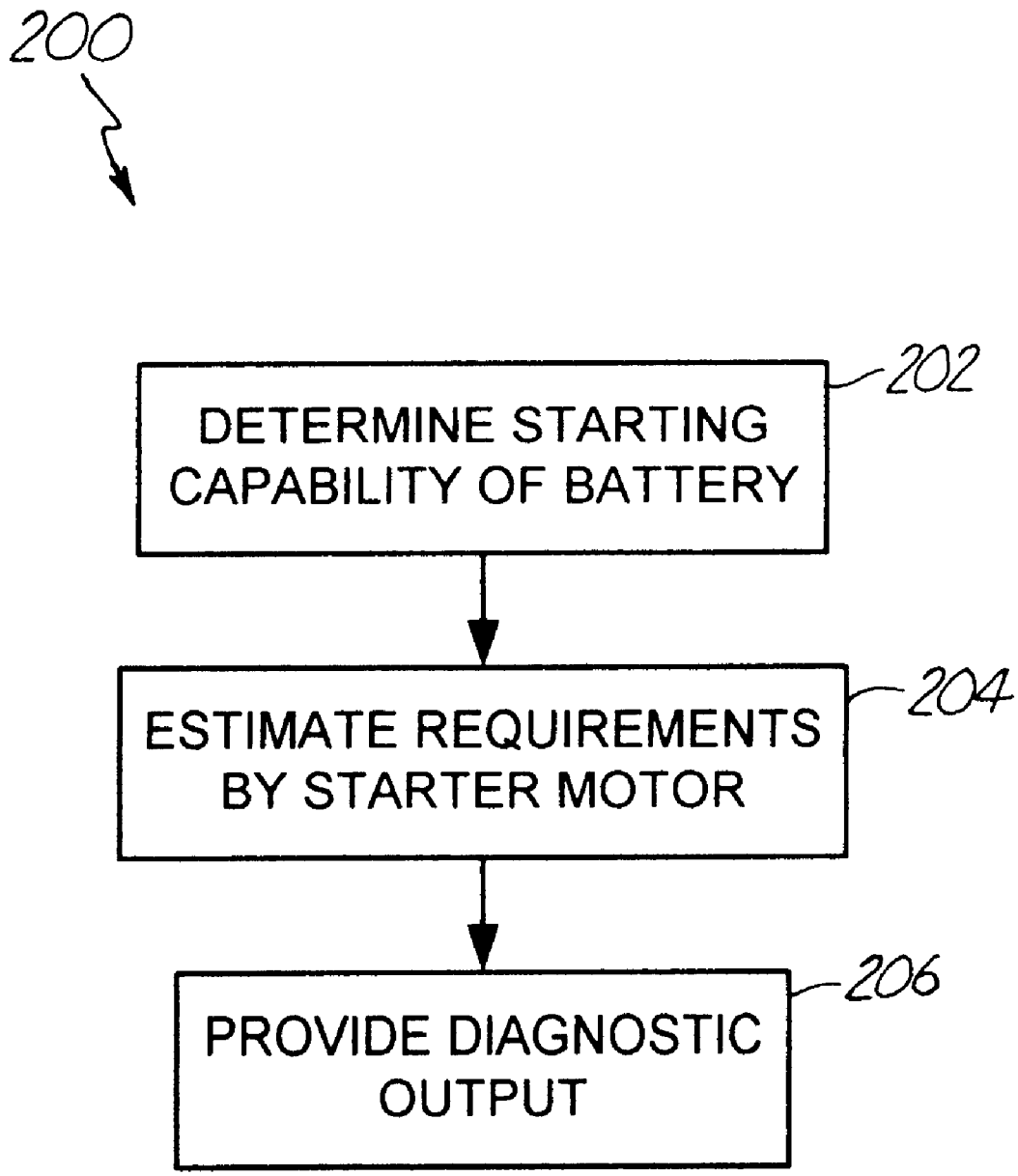
FIG. 5 is a simplified block diagram which illustrates performing diagnostics on a starter motor of the vehicle of FIG. 1.

Using the battery state of charge and the battery state of health, battery monitor 12 can predict the starting capabilities of a starter motor of vehicle 10. For example, by comparing the amount of current measured by current sensor 26 which has been previously been required to start the engine of vehicle 10 for a particular temperature, microprocessor 22 can determine if the current state of charge of the battery for the current state of health at the current temperature will be sufficient to provide enough current to start the engine. The performance and any degradation in the starter motor can also be taken into account by microprocessor 22. For example, if the amount of current required to start the engine has been increasing with time, microprocessor 22 can extrapolate and predict what amount of current will be required to start the engine in the future. FIG. 5 is a simplified block diagram 200 which illustrates steps performed by a microprocessor 22 in diagnosing the starting capability of battery 18. At block 202, microprocessor 22 determines the starting capability of battery 18. For example, the starting capability can be an estimation or measurement of the amount of current which battery 18 can supply over a short duration. At block 204, microprocessor 22 estimates the starting requirements of the starting motor of the engine of vehicle 10. For example, the past requirements of the starter motor can be recalled from memory 40 and any trend can be used to predict what will be required for starting the engine. Other inputs can also be used in this determination such as the current temperature. At block 206, a starter diagnostic output is provided. For example, if it appears that the battery will have difficulty in operating the starter motor for a sufficient duration to start the motor of the vehicle, vehicle loads 14 can be selectively switched off by microprocessor 22 through I/O 30. Additionally, a warning can be provided to an operator through user I/O 32 of an impending problem, prior to its actual occurrence, such that the battery 18 can be replaced.

In another aspect of the invention, microprocessor 22 can be adapt or alter the performance of the engine and/or loads 14 based upon a number of different parameters in order to provide optimal charging to battery 18. For example, microprocessor 22 can interface to a data bus of a microprocessor of the vehicle 10 through I/O 30 to control engine operation. Alternatively, microprocessor 22 can be the same microprocessor used to control vehicle operation. The microprocessor 22 can adjust the idle speed of the engine, shift points of the transmission and the load placed on the electrical system by some of the loads 14 to increase or decrease the rate of battery charging based upon the expected driving patterns of an operator. For example, if the microprocessor has observed that the vehicle is normally operated for a short duration, the microprocessor 22 can increase the idle speed of the engine and attempt to reduce loads placed on battery 18 to increase the charging rate of battery 18. Further, microprocessor 22 can alter the shift points of the transmission to cause the engine to operate at a high (or lower) speed than normal. The prediction of engine operation can also be based upon time of day and the day of the week such that repeated driving patterns can be accounted for, for example, commuting to work. Further, in vehicles where it is possible to recognize the operator of the vehicle, such as through the seat position memory in a power seat of the vehicle, microprocessor 22 can alter the charging pattern based upon the driving characteristics of a specific driver.

Figure 6:
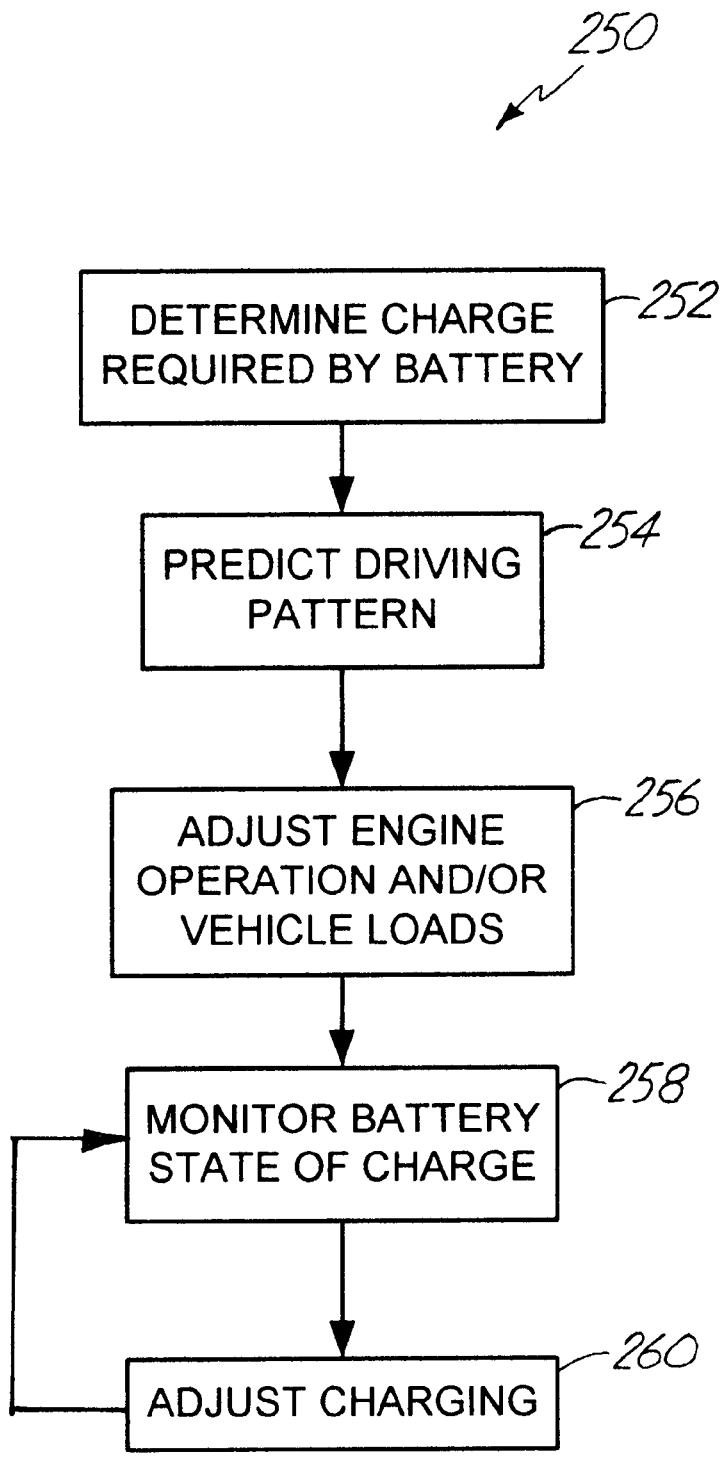
FIG. 6 is a simplified block diagram showing steps related to adjusting the charging profile for charging the battery of the vehicle of FIG. 1.

FIG. 6 is a simplified block diagram flowchart 250 showing steps performed by microprocessor 22 in adjusting engine speed or loads to control the charge in battery 18. Block 252, microprocessor 22 determines the charge required by battery 18 to become fully charged, this determination can be based upon a measurement of the current charge level of battery and a determination of the maximum amount of charge that battery 18 can hold, for example, as a function of the state of health of battery 18. At block 254, microprocessor 22 predicts the expected driving pattern for the upcoming engine use. At block 256, microprocessor 22 adjusts the engine operation and/or vehicle loads 14 in order to optimize the charging of the battery 18 based upon the charge required as determined at step 252 and the driving pattern predicted at step 254. During engine operation, microprocessor 22 continues to monitor the battery state of charge at block 258 and adjusts the charging accordingly at block 260. Once battery 18 has been fully charged, the microprocessor 22 can reduce the charging rate as appropriate.

If the drive cycle is, or has tendency to be, insufficient to charge the battery 18, microprocessor 22 can provide an output to an operator through user I/O 32 to indicate that either the vehicle must be driven for an extended period of time or an alternative charging method be used to charge battery 18. An indication can also be provided as to a prediction regarding how many further such drive cycles can be supported by the battery 18 before it will have insufficient remaining charge to start the vehicle.

Figure 7:
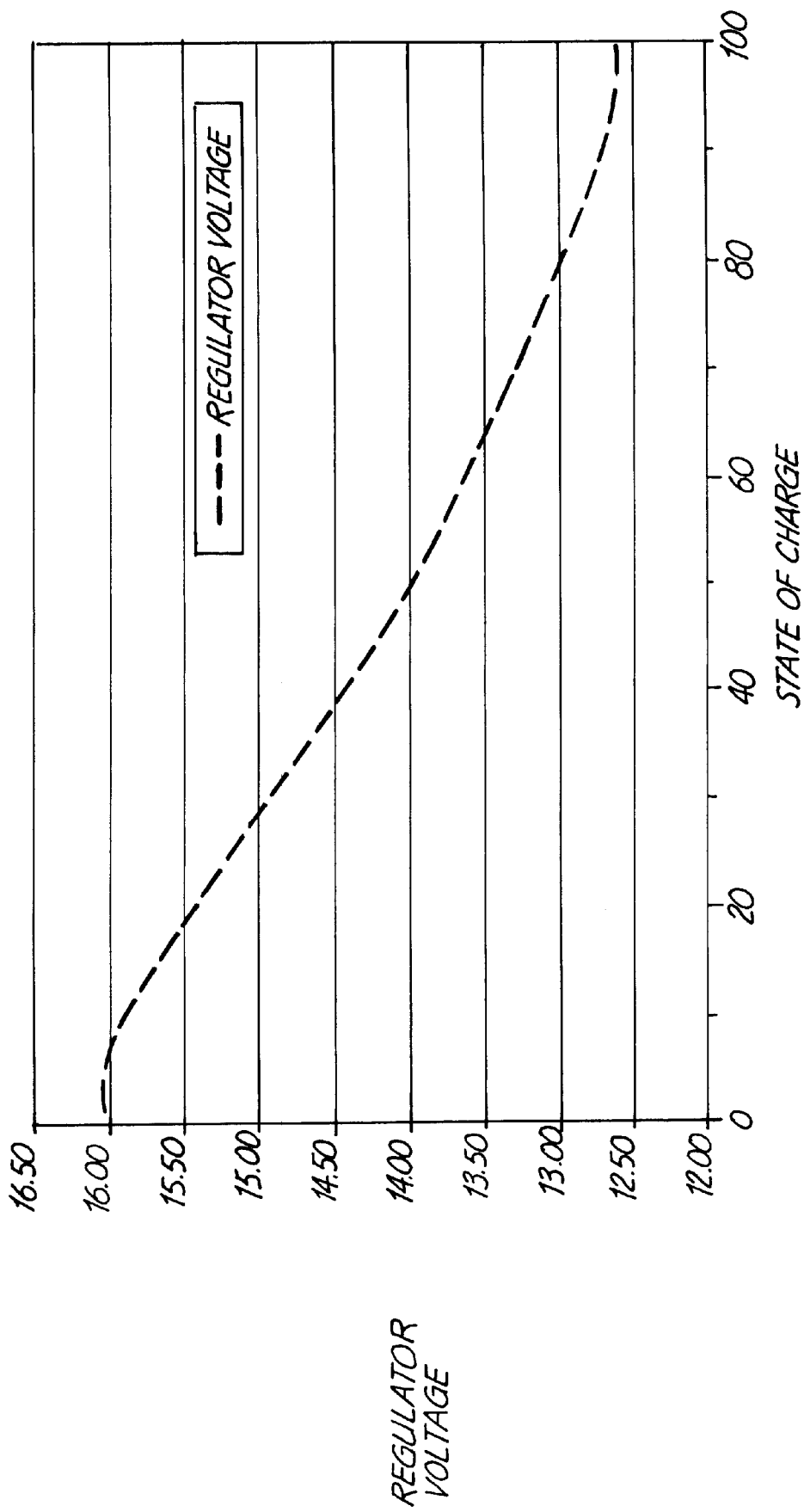
FIG. 7 is a graph which illustrates one sample curve of regulator voltage output versus state of charge for the battery of FIG. 1.

As discussed above, in one aspect of the present invention, the output from the alternator 20 is adjusted based upon the state of charge and/or the state of health determination(s). FIG. 7 is a graph showing the regulator voltage output from alternator 20 as a function of the state of charge of battery 18. As illustrated in FIG. 7, microprocessor 22 reduces the voltage output from alternator 20 as the state of charge of battery 18 increases to 100% charge. The particular profile can be adjusted to a specific battery, alternator and/or engine configuration or to the driving characteristics of an operator. Such a system can significantly reduce or eliminate overcharging of battery 10 and the generation of excessive heat. Further, such a technique can be used to reduce or eliminate the undercharging of battery 10. Additionally, by adjusting the voltage based upon the state of charge, battery 18 and system component life will increase. For example, vehicle loads 14 will be exposed to over voltages for a reduced amount of time. This also allows the various systems components to be optimized for particular charging requirements or voltage levels. In general, the output of the alternator 20 can be reduced and the battery capacity required for a particular vehicle can be reduced because battery charge will be more efficiently maintained. This can reduce overall vehicle weight and improve vehicle mileage. Further still, IR (current-resistance) type losses in the electrical system and overcharging will be reduced thereby reducing the load on the vehicle engine and improving efficiency of the vehicle. In general, this technique will improve vehicle reliability by reducing heat due to excessive IR losses, increasing battery life, providing early detection of impending battery failure and insuring proper vehicle operation even with after market batteries which are used to replace the original battery.

If such a system is implemented when the vehicle is originally manufactured, monitor 12 allows battery management over the entire life of the vehicle. This can be both during assembly and delivery of the vehicle as well as during the lifespan of actual vehicle operation. Additionally, one aspect includes a storage battery 18 with rating information carried in a computer storage device such as a digital memory within a housing of the battery. This data can be communicated to monitor 12 through I/O 30. In one aspect, the electrical connections to the battery are also used as a data communication bus such that monitor 12 can communicate with the storage device in battery 18. The storage device can also be used to store the history, such as the charging and usage history, of battery 18.

Battery monitor 12 can monitor and diagnose operation of alternator 20. For example, a typical alternator provides a multiphase output. By monitoring the data points collected and stored in memory 40, microprocessor 22 can observe the loss of one or more phases in the alternator's output. Similarly, the failure of a rectifying diode in alternator 20 can be detected by microprocessor 22 by observing an asymmetrical ripple pattern. Microprocessor 22 can provide an output to an operator through user I/O 32 such as a "service alternator soon" output. This information can also be communicated to the vehicle microprocessor through I/O 30.

I/O 30 is shown in schematic form and can be any type of input or output and represents, in some embodiments, multiple input(s) and output(s). Various examples of inputs and outputs include a connection to a databus of the vehicle, a connection to a databus adapted to couple to a diagnostic device such as that provided in service equipment, a connection to a remote vehicle monitoring system, such as one that is capable of coupling through a cellular phone connection of the vehicle. In such an embodiment, the vehicle is capable of recording and reporting information to a remote service such as an emergency assistance service or a service provided to monitor the operation of the vehicle and suggest that maintenance be provided. Various types of inputs and outputs can be provided through direct connections or through non-physical connections such as radio frequency or infrared communication techniques. The particular form of the data and standard used for the inputs and outputs can be selected as proprietary or industry standards. Microprocessor 22 can also be capable of providing advanced reporting and control functions through the use of standardized interfaces such as are available through HTML, XML, or various known or proposed alternatives. In such an embodiment, information collected by microprocessor 22 can be viewed through a "web page" interface provided by a browser. Such an embodiment is advantageous because it can provide a user input/output such as user I/O 32 in a standardized form such that it can be viewed or controlled through many types of standardized devices. In such an embodiment, information can be reported to, or the monitor 12 can be controlled, from a remote location. Additionally, if the vehicle 10 includes a browser type interface which may become commonly available in vehicles, the microprocessor 22 can be controlled and communicate through the vehicle's browser. In one aspect, vehicle monitor includes an IP (Internet Protocol) address such that it is capable of communicating in accordance with the Internet Protocol. When coupled to, for example, a cellular telephone connection of the vehicle, the battery monitor 12 is capable of being monitored and controlled from a remote location coupled through the Internet. However, as mentioned above, such an interface also provides a simple technique for interfacing the monitor 12 with a local computer in the vehicle and displaying information from the monitor 12 for use or control by an operator.

Through the use of the data collected by microprocessor 22 and memory 40, microprocessor 22 is also capable of detecting the imminent failure of the starter motor of the vehicle. For example, by monitoring the voltage drop through the system during starting, microprocessor 22 can determine the average time to start the engine and the average and peak currents required during starting. Changes in these, or other, measurement values can indicate a degrading starter motor. Upon detection of an impending failure, a "service starter motor soon" indication can be provided to an operator through user interface 32.

Microprocessor 22 can provide an indication that the battery 18 has insufficient capacity or substandard performance and alert an operator accordingly. For example, upon power up, such as that which occurs when battery 18 is replaced, microprocessor 22 can measure the capacity of the battery 18 and provide an indication to the operator if the capacity is less than a threshold level determined by the vehicle manufacturer and stored in the memory of the vehicle computer system.

Microprocessor 22 can generate an audit code (or a warranty code) in response to the various tests and data collected. Such codes are described in U.S. Pat. No. 6,051, 976, issued Apr. 18, 2000, entitled METHOD AND APPARATUS FOR AUDITING A BATTERY TEST which is assigned to the present assignee and is incorporated herein by reference. In such an embodiment, microprocessor 22 encodes data collected or obtained during its operation. For example, raw data related to a battery test can be obtained and/or the ultimate result of the battery test and subsequently encoded by microprocessor 22. The encoding can be a simple transposition cipher in which the locations and values of various bytes of information are rearranged. Such a code can be designed to prevent falsification of data which can occur where unscrupulous individuals are attempting to submit a falsified warranty claim for a failed component to a manufacturer. This coding technique allows the manufacturer to verify information when a warranty is submitted. Additionally, the information can be used to track operator error and assist in identification and isolation of component failure in order to redesign the components and reduce such failures.

In another aspect, microprocessor 22 is capable of automatically calibrating the measurements obtained from voltage sensor 24 and current sensor 26. Using this aspect of the invention, microprocessor 22 can perform automatic or periodic calibrations to maintain accuracy over the lifespan of the vehicle. Automatic calibration can be provided by selectively switching in calibrated elements having known temperature and time drift characteristics, and using the measured data to correct for instrumentation gains and offsets. For example, a known resistance or voltage source can be selectively coupled to amplifiers 47 or 52. Any offset values from these known values can be stored in memory 40 and used by microprocessor 22 to compensate for errors in measurements.

With the present invention, any polarization of the battery 18 such as that which can result from charging or starting operations, does not produce errors in the measurements performed by microprocessor 22. Specifically, any such errors are eliminated by use of a real-time state of charge algorithm that is independent of the real time battery terminal voltage.

When the engine of vehicle 10 is not operating, microprocessor 22 can enter a sleep mode to reduce current draw and the resultant discharge of battery 18. If desired, microprocessor 22 can periodically "wake up" to perform tests or monitor some aspect of the electrical system of vehicle 10.

A loose or corroded connection to battery 18 can be detected by microprocessor 22 by observing a sudden increase in the resistance across battery 18. An error can be provided to an operator through user interface 32 to alert the operator of the degraded connection.

Microprocessor 22 can also perform diagnostics on the electrical system of vehicle 12 when the engine is not operating. For example, microprocessor 22 can monitor the current being drawn by loads 14 when the engine is not running using current sensor 26. For example, microprocessor 22 can compare the rate of current draw, over a selectable sample period with a threshold stored in memory 40. If the measured rate exceeds the threshold, there may be a fault in the electrical system of the vehicle. Similarly, a small but constant current drain can also indicate a fault which could lead to the discharge of battery 18. Microprocessor 22 can provide an indication to the user through user interface 32 that excessive current draw has occurred while the engine is off. Such current draw can lead to rapid discharge of battery 18 and prevent starting.

Current sensor 26 can also be used by microprocessor 22 to monitor the current flowing into and out of battery 18. The summation of this current, taken over a time period (i.e., integration) can provide an indication that the battery is not receiving sufficient charge, or can provide an indication of the total charge received by battery 18. This information can be displayed to an operator through user I/O 32. Additionally, the information can be provided on I/O 30. If the information indicates that the battery 18 is not receiving sufficient charge, steps can be taken as discussed above, to increase the charging rate of battery 18.

In one embodiment, microprocessor 22 stores information in memory 40 related to the model number, and/or serial number, capacity or other information related to battery 18. In such an embodiment, battery monitor 12 can be a physical part of battery 18 such that battery specific information can be programmed into memory during manufacture. The battery monitor 12 can provide an output to an operator through a display or other type of output device which is physically located on the battery 18. Additionally, the display or user I/O 32 can be located within the vehicle. Input/output 30 can be configured to couple to the databus of the vehicle. For example, the battery 18 can include a data plug adapted to plug into the databus of the vehicle such that monitor 12 can exchange information through the databus. Microprocessor 22 can then report this information to the databus of the vehicle using input/output 30. This allows the microprocessor of the vehicle the ability to perform advanced diagnostics and monitoring as the specific battery type is known.

Although the present invention has been described with reference to preferred embodiments, workers skilled in the art will recognize that changes may be made in form and detail without departing from the spirit and scope of the invention. For example, the circuitry and circuit configuration is provided as simply one embodiment and those skilled in the art will recognize that other configurations can be provided. The particular connections to the battery can be through Kelvin connections which include a "split" Kelvin connection in which the forcing function connection(s) are/is spaced apart from the battery such as that described and illustrated in U.S. patent application Ser. No. 09/431,697, filed Nov. 1, 1999 and entitled ELECTRICAL CONNECTION FOR ELECTRONIC BATTERY TESTER which is incorporated herein by reference in its entirety. In a further example of the present invention, alternator 20 can comprise an electronic battery charger such as those used to charge automotive vehicles when the vehicle is stationary or to charge stand by batteries such as those used in remote systems such as cellular sites. In such an embodiment, control line 23 is used to adjust the charger of battery 18 using the techniques set forth herein. In such an embodiment, element 10 shown in FIG. 1 illustrates a standby power supply for equipment.

What is claimed is:

1. A method of charging a battery in a vehicle having an internal combustion engine configured to drive an alternator electrically coupled to the battery and adapted to charge the battery with a charge signal applied to the battery, the method comprising:

coupling to the battery through a four point Kelvin connection;

measuring a dynamic parameter of the battery using the Kelvin connection, the dynamic parameter measurement a function of a time varying signal;

determining a condition of the battery as a function of the measured dynamic parameter; and controlling the charge signal in response to the determined condition of the battery.

2. The method of claim 1 wherein determining a condition of the battery includes determining a state of charge of the battery and wherein the charge signal is controlled according to the determined state of charge.

3. The method of claim 1 wherein controlling the charge signal comprises regulating a charging voltage applied to the battery according to the determined condition of the battery.

4. The method of claim 2 wherein controlling the charge signal comprises regulating a charging voltage applied to the battery according to the determined state of charge.

5. An apparatus for monitoring the condition of a storage battery while the storage battery is coupled in parallel to an electrical system of an operating vehicle, comprising:

a first electrical connection directly coupled to a positive terminal of the battery;

a second electrical connection directly coupled to a negative terminal of the battery, the first and second electrical connections coupled to a voltmeter to measure a time varying voltage across the battery;

a third electrical connection directly coupled to the positive terminal of the battery;

a fourth electrical connection directly coupled to a negative terminal of the battery the third and fourth electrical connections coupled to a forcing function having a time varying component;

a current sensor electrically in series with the battery; and a microprocessor configured to determine the condition of the battery as a function of a dynamic parameter of the battery based upon the measured voltage, the forcing function and the current sensed by the current sensor.

6. The apparatus of claim 5 further comprising an alternator electrically coupled to the battery and adapted to charge the battery with a charge signal applied to the battery in response to an alternator control signal, wherein the alternator control signal is produced by the microprocessor as a function of the dynamic parameter.

7. The apparatus of claim 6 wherein the charge signal comprises a charging voltage.

8. The apparatus of claim 5 wherein the microprocessor is configured to determine a state of charge of the battery as a function of a dynamic parameter of the battery based upon the measured voltage, the forcing function and the current sensed by the current sensor.

9. The apparatus of claim 8 further comprising an alternator electrically coupled to the battery and adapted to charge the battery with a charge signal applied to the battery in response to an alternator control signal, wherein the alternator control signal is produced by the microprocessor as a function of the determined state of charge.

10. The apparatus of claim 9 wherein the charge signal comprises a charging voltage.

11. The apparatus of claim 9 wherein the microprocessor is further configured to produce a vehicle-performance-parameter control signal based upon the determined state of charge, wherein the vehicle-performance-parameter control signal controls a vehicle performance parameter that affects the magnitude of the charge signal applied to the battery.

12. The apparatus of claim 8 wherein the microprocessor is further configured to determine a state of health of the battery as a function of a dynamic parameter of the battery based upon the measured voltage, the forcing function and the current sensed by the current sensor, wherein the apparatus further comprises a computer memory device configured to store data regarding the starting performance of the battery as a function of state of health and state of charge, and wherein the microprocessor is further configured to determine a likelihood that the vehicle will start based upon the determined state of health, the determined state of charge and the stored starting performance data.

13. A method of determining the starting capability of a vehicle, comprising:
    determining a state of charge of a vehicle battery;
    determining a state of health of the vehicle battery;
    determining a previous starting performance of the vehicle under similar conditions to the determined state of charge and state of health; and
    determining a likelihood that the vehicle will start based upon the previous starting performance.

14. A method of controlling the charging rate of a vehicle storage battery during operation of the vehicle, comprising:
    determining the state of charge of the battery;
    charging the battery with a charge signal generated by an alternator; and
    controlling a vehicle performance parameter based upon the determined state of charge, wherein the vehicle performance parameter is a parameter that affects the magnitude of the charge signal generated by the alternator.

15. A method of detecting that an initially installed vehicle battery has been replaced with a second vehicle battery, comprising:
    measuring a value of a battery performance parameter;
    calculating the difference between the measured value of the performance parameter and a predetermined value of the performance parameter; and
    determining whether the initially installed vehicle battery has been replaced by a second battery based upon the difference between the measured value of the performance parameter and the predetermined value of the performance parameter.

16. A method of charging a battery in a standby power system having a charger electrically coupled to the battery and adapted to charge the battery with a charge signal applied to the battery, the method, comprising:
    coupling to the battery through a four point Kelvin connection;
    measuring a dynamic parameter of the battery using the Kelvin connection, the dynamic parameter measurement a function of a time varying signal;
    determining a condition of the battery as a function of the measured dynamic parameter; and
    controlling the charge signal in response to the determined condition of the battery.

17. The method of claim 16 wherein determining a condition of the battery includes determining a state of charge of the battery and wherein the charge signal is controlled according to the determined state of charge.

18. The method of claim 16 wherein controlling the charge signal comprises regulating a charging voltage applied to the battery according to the determined condition of the battery.

19. The method of claim 17 wherein controlling the charge signal comprises regulating a charging voltage applied to the battery according to the determined state of charge.

20. An apparatus for monitoring the condition of a storage battery in a standby power system while the storage battery is coupled to an electrical system, comprising:
    a first electrical connection directly coupled to a positive terminal of the battery;
    a second electrical connection directly coupled to a negative terminal of the battery, the first and second electrical connections coupled to a voltmeter to measure a time varying voltage across the battery;
    a third electrical connection directly coupled to the positive terminal of the battery;
    a fourth electrical connection directly coupled to a negative terminal of the battery, the third and fourth electrical connections coupled to a forcing function having a time varying component;
    a current sensor electrically in series with the battery; and
    a microprocessor configured to determine the condition of the battery as a function of a dynamic parameter of the battery based upon the measured voltage, the forcing function and the current sensed by the current sensor.

21. The apparatus of claim 20 further comprising a charger electrically coupled to the battery and adapted to charge the battery with a charge signal applied to the battery in response to a charge control signal, wherein the charge control signal is produced by the microprocessor as a function of the dynamic parameter.

22. The apparatus of claim 21 wherein the charge signal comprises a charging voltage.

23. The apparatus of claim 20 wherein the microprocessor is configured to determine a state of charge of the battery as a function of a dynamic parameter of the battery based upon the measured voltage, the forcing function and the current sensed by the current sensor.

24. The apparatus of claim 23 further comprising a charger electrically coupled to the battery and adapted to charge the battery with a charge signal applied to the battery in response to a charge control signal, wherein the charge control signal is produced by the microprocessor as a function of the determined state of charge.

25. The apparatus of claim 24 wherein the charge signal comprises a charging voltage.

26. The method of claim 1 including sensing electrical current through the battery and wherein controlling the charge signal is further in response to the sensed electrical current.

27. The method of claim 1 wherein controlling the charge signal comprises controlling an alternator of the vehicle.

28. The method of claim 1 including responsively controlling a vehicle performance parameter based upon the determined condition of the battery.

29. The method of claim 1 including determining a likelihood that the engine of the vehicle will start.

30. The method claim 29 wherein determining the likelihood that the vehicle will start is a function of a determined state of health and determined state of charge of the battery and stored starting performance data.

31. The method of claim 30 wherein the stored starting performance data includes a previous starting performance of the vehicle under similar conditions.

32. The method of claim 1 including determining whether the battery has been replaced.

33. The method of claim 1 including coupling to an internal databus of the vehicle.

34. The method of claim 1 including applying a forcing function to the battery and wherein measuring a dynamic parameter of the battery is a function of the applied forcing function.

35. The method of claim 1 including providing a user input/output.

36. The method of claim 1 including measuring a voltage drop across a current shunt placed in series with the battery.

37. The method of claim 1 wherein the dynamic parameter is selected from the group of dynamic parameter consisting of dynamic resistance, dynamic conductance, dynamic admittance, dynamic impedance and their combinations.

38. The method of claim 1 wherein determining a condition of the battery is based upon a characterization curve which provides a functional relationship between the dynamic parameter and battery condition.

39. The method of claim 1 wherein determining a condition of the battery is adjusted based upon a parameter of the battery.

40. The method of claim 1 wherein the measured dynamic parameter is a function of synchronized voltage and current measurements.

41. The method of claim 1 including detecting a failure of a voltage regulator of the vehicle based upon a measured voltage.

42. The method of claim 1 including detecting a failure of an alternator of the vehicle based upon a measured voltage.

43. The method of claim 1 including measuring battery temperature and wherein determining a condition of the battery is a function of measured battery temperature.

44. The method of claim 1 wherein determining a condition of the battery is a function of Cold Cranking Amps (CCA) capacity of the battery.

45. The method of claim 1 wherein determining a condition of the battery is a function of averaged dynamic measurements from the battery.

46. The method of claim 45 wherein data samples are obtained through an analog to digital converter having a dynamic range substantially equal to a range of the samples.

47. The method of claim 46 including providing an output if battery capacity is less than a threshold level.

48. The method of claim 1 including determining state of charge based upon a parameter selected from the group of parameters consisting of battery state of health, of battery temperature, of battery charge balance, battery charging efficiency and initial battery conditions.

49. The method of claim 1 wherein determining a condition of the battery is based upon artificial intelligence techniques.

50. The method of claim 1 wherein the time varying signal comprises a forcing function applied by selectively coupling a resistive load to the battery.

51. The method of claim 1 wherein the dynamic parameter of the battery is a function of voltage change.

52. The method of claim 1 wherein the dynamic parameter of the battery is a function of change in total current flowing through the battery.

53. The method of claim 1 including providing a "service battery soon" output based upon battery condition.

54. The method of claim 1 including diagnosing battery condition.

55. The method of claim 54 wherein diagnosing battery condition is a function of if-then rules.

56. The method of claim 54 wherein diagnosing battery condition is a function of comparison to a threshold.

57. The method of claim 1 wherein determining a battery condition includes applying the dynamic parameter to a neural network.

58. The method of claim 57 including training the neural network.

59. The method of claim 50 wherein the forcing function comprises a square wave.

60. The method of claim 1 wherein determining a condition of the battery comprises determining battery state of charge as a function of battery state of health and battery temperature.

61. The method of claim 60 wherein the state of charge is a function of current flowing into or out of the battery.

62. The method of claim 1 including predicting an ability of the battery to start the engine of the vehicle.

63. The method of claim 62 including monitoring starting performance of the battery and wherein the predicting is based upon the monitored starter performance.

64. The method of claim 63 including removing vehicle electrical loads during starting of the engine.

65. The method of claim 1 including controlling the charge signal based upon idle speed of the engine.

66. The method of claim 1 including controlling the charge signal based upon shift points of a transmission coupled to the engine.

67. The method of claim 1 including controlling the charge signal based upon electrical loads of the vehicle applied to the battery.

68. The method of claim 1 including adjusting an idle speed of the vehicle based upon the determined condition.

69. The method of claim 1 including adjusting shift points of a transmission coupled to the engine based upon the determined condition of the battery.

70. The method of claim 1 wherein controlling the charge signal is further based upon identification of a vehicle operator.

71. The method of claim 1 including controlling the charge signal based upon identification of a driving pattern.

72. The method of claim 1 including reducing the charge signal when the determined condition indicates that the battery is fully charged.

73. The method of claim 1 including monitoring multiple phases produced by the alternator and responsively diagnosing alternator condition.

74. The method of claim 1 including outputting diagnostic information on a databus of the vehicle.

75. The method of claim 1 including outputting diagnostic information on a cellular phone of the vehicle.

76. The method of claim 1 including outputting diagnostic information over a non-physical connection.

77. The method of claim 1 including outputting diagnostic information in the form of a web page.

78. The method of claim 1 wherein the vehicle includes a internet protocol address.

79. The method of claim 1 including diagnosing a condition of a starter motor as a function of the measured dynamic parameter.

80. The method of claim 1 including providing a warranty code output.

81. The method of claim 1 including automatically calibrating the measured dynamic parameter.

82. The method of claim 1 including entering a sleep mode during periods of engine inactivity.

83. The method of claim 1 including identifying a loose or corroded connection to the battery.

84. The method of claim 1 including performing diagnostics on an electrical system of the vehicle when the engine is not operating.

85. The method of claim 1 wherein a Kelvin connection is "split".

86. Computer software configured to implement the method of claim 1.

87. A battery charger in a vehicle which operates in accordance with the method of claim 1.

88. The apparatus of claim 5 wherein the microprocessor is further configured to determine a likelihood that the battery will start an engine of the vehicle.

89. The apparatus claim 88 wherein the determination of likelihood that an engine of the vehicle will start is a function of a determined state of health and determined state of charge of the battery and stored starting performance data.

90. The apparatus of claim 89 wherein the stored starting performance data includes a previous starting performance of the vehicle under similar conditions.

91. The apparatus of claim 5 wherein the microprocessor is further configured to determine whether the battery has been replaced.

92. The apparatus of claim 5 wherein the microprocessor couples to an internal databus of the vehicle.

93. The apparatus of claim 5 including a forcing function applied to the battery and wherein the dynamic parameter of the battery is a function of the applied forcing function.

94. The apparatus of claim 5 including a user input/output.

95. The apparatus of claim 5 wherein the current sensor comprises a voltmeter configured to measure voltage across a current shunt placed in series with the battery.

96. The apparatus of claim 5 wherein the dynamic parameter is selected from the group of dynamic parameter consisting of dynamic resistance, dynamic conductance, dynamic admittance, dynamic impedance and their combinations.

97. The apparatus of claim 5 wherein the condition of the battery is determined based upon a characterization curve which provides a functional relationship between the dynamic parameter an d battery condition.

98. The apparatus of claim 5 wherein the condition of the battery is adjusted based upon a parameter of the battery.

99. The apparatus of claim 5 wherein the measured dynamic parameter is a function of synchronized voltage and current measurements.

100. The apparatus of claim 5 wherein the microprocessor detects a failure of a voltage regulator of a charge system of the vehicle based upon a measured voltage.

101. The apparatus of claim 5 wherein the microprocessor detects a failure of an alternator of the vehicle based upon a measured voltage.

102. The apparatus of claim 5 including a battery temperature sensor and wherein the condition of the battery is a function of measured battery temperature.

103. The apparatus of claim 5 wherein the condition of the battery is a function of Cold Cranking Amps (CCA) capacity of the battery.

104. The apparatus of claim 5 wherein the condition of the battery is a function of averaged dynamic measurements from the battery.

105. The apparatus of claim 104 including an analog to digital converter configured to provide samples signals, the converter having a dynamic range substantially equal to a range of the samples.

106. The apparatus of claim 5 including an output indicative of a battery capacity less than a threshold level.

107. The apparatus of claim 5 wherein the microprocessor determines a state of charge of the battery based upon a parameter selected from the group of parameters consisting of battery state of health, of battery temperature, of battery charge balance, battery charging efficiency and initial battery conditions.

108. The apparatus of claim 5 wherein the microprocessor determines a condition of the battery based upon artificial intelligence techniques.

109. The apparatus of claim 5 wherein the dynamic parameter of the battery is a function of a voltage change.

110. The apparatus of claim 5 wherein the dynamic parameter of the battery is a function of a change in total current flowing through the battery.

111. The apparatus of claim 5 including providing a "service battery soon" output based upon battery condition.

112. The apparatus of claim 5 wherein the microprocessor diagnoses battery condition is a function of if-then rules.

113. The apparatus of claim 5 wherein battery condition is a function of comparison to a threshold.

114. The apparatus of claim 5 wherein the microprocessor determines a battery condition by application of the dynamic parameter to a neural network.

115. The apparatus of claim 114 wherein the microprocessor is configured to implement training of the neural network.

116. The apparatus of claim 93 wherein the forcing function comprises a square wave.

117. The apparatus of claim 5 wherein the condition of the battery comprises battery state of charge which is determined as a function of battery state of health and battery temperature.

118. The apparatus of claim 117 wherein the state of charge is a function of current flowing into and/or out of the battery.

119. The apparatus of claim 5 wherein the microprocessor predicts an ability of the battery to start an engine of the vehicle.

120. The apparatus of claim 119 wherein the microprocessor monitors starting performance of the battery and wherein the prediction of the ability to start the engine is based upon the monitored starter performance.

121. The apparatus of claim 120 wherein vehicle electrical loads are removed by the microprocessor during starting of the engine.

122. The apparatus of claim 6 wherein the microprocessor controls the charge signal based upon idle speed of the engine.

123. The apparatus of claim 6 wherein the microprocessor controls the charge signal based upon shift points of a transmission coupled to the engine.

124. The apparatus of claim 6 wherein the microprocessor controls the charge signal based upon electrical loads of the vehicle applied to the battery.

125. The apparatus of claim 5 wherein the microprocessor adjusts an idle speed of the vehicle based upon the determined battery condition.

126. The apparatus of claim 5 wherein the microprocessor adjusts shift points of a transmission coupled to the engine based upon the determined condition of the battery.

127. The apparatus of claim 6 wherein the microprocessor controls the charge signal based upon an identification of a vehicle operator.

128. The apparatus of claim 6 wherein the microprocessor controls the charge signal based upon identification of a driving pattern.

129. The apparatus of claim 6 wherein the microprocessor reduces the charge signal when the determined condition of the battery indicates that the battery is fully charged.

130. The apparatus of claim 5 wherein the microprocessor monitors multiple phases produced by an alternator of the vehicle and responsively diagnoses alternator condition.

131. The apparatus of claim 5 wherein the microprocessor outputs battery diagnostic information on a databus of the vehicle.

132. The apparatus of claim 5 wherein the microprocessor outputs battery diagnostic information on a cellular phone of the vehicle.

133. The apparatus of claim 5 wherein the microprocessor outputs battery diagnostic information over a non-physical connection.

134. The apparatus of claim 5 wherein the microprocessor outputs battery diagnostic information in the form of a web page.

135. The apparatus of claim 5 wherein the vehicle includes a internet protocol address.

136. The apparatus of claim 5 wherein the microprocessor diagnoses a condition of a starter motor of the vehicle as a function of a measured voltage.

137. The apparatus of claim 5 wherein the microprocessor provides a warranty code output.

138. The apparatus of claim 5 wherein the microprocessor automatically calibrates the measured dynamic parameter.

139. The apparatus of claim 5 wherein the microprocessor enters a sleep mode during periods of engine inactivity.

140. The apparatus of claim 5 wherein the microprocessor identifies a loose or corroded connection to the battery.

141. The apparatus of claim 5 wherein the microprocessor performs diagnostics on an electrical system of the vehicle when an engine of the vehicle is not operating.

142. The apparatus of claim 5 wherein a Kelvin connection formed by the electrical connections is "split".

143. The method of claim 13 wherein the stored previous starting performance data includes a previous starting performance of the vehicle under similar conditions.

144. The method of claim 13 wherein the state of charge is a function of a dynamic parameter of the battery.

145. The method of claim 144 wherein the dynamic parameter is a function of a forcing function applied to the battery.

146. The method of claim 144 wherein the dynamic parameter is measured using Kelvin connections electrically coupled to the battery.

147. The method of claim 144 wherein the dynamic parameter is a function of synchronized voltage and current measurements.

148. The method of claim 13 including detecting a failure of a voltage regulator of the vehicle based upon a measured voltage.

149. The method of claim 13 including detecting a failure of an alternator of the vehicle based upon a measured voltage.

150. The method of claim 13 including measuring battery temperature and wherein determining likelihood that the vehicle will start a function of measured battery temperature.

151. The method of claim 13 wherein determining a state of charge of the battery is a function of averaged dynamic measurements from the battery from a plurality of data samples.

152. The method of claim 151 wherein the samples are provided to an analog to digital converter having a dynamic range substantially equal to a range of the samples.

153. The method of claim 13 wherein determining state of charge is based upon a parameter selected from the group of parameters consisting of battery state of health, of battery temperature, of battery charge balance, battery charging efficiency and initial battery condition.

154. The method of claim 144 wherein the dynamic parameter of the battery is a function of change in total current flowing through the battery.

155. The method of claim 144 wherein determining battery state of charge includes applying the dynamic parameter to a neural network.

156. The method of claim 13 wherein the battery state of charge is a function of battery temperature.

157. The method of claim 13 including removing vehicle loads during starting of the engine.

158. The method of claim 13 including outputting information related to the likelihood that the vehicle will start on a databus of the vehicle.

159. The method of claim 13 including outputting diagnostic information on a cellular phone of the vehicle.

160. The method of claim 13 including diagnosing a condition of a starter motor as a function of a measured voltage.

161. The method of claim 13 including providing a warranty code output.

162. The method of claim 13 including entering a sleep mode during periods of engine inactivity.

163. The method of claim 13 wherein determining a state of health of the vehicle battery comprises measuring a dynamic parameter of the battery.

164. The method of claim 13 including providing a "service battery soon" output based upon the likelihood that the vehicle will start.

165. The method of claim 13 including measuring a temperature and wherein determining previous starting performance is further a function of the measured temperature.

166. The method of claim 165 wherein the measured temperature comprises battery temperature.

167. Software configured to implement the method of claim 13.

168. An apparatus for determining the likelihood that the battery will start the vehicle which operates in accordance with the method of claim 13.

169. The method of claim 14 wherein determining the state of charge comprises measuring a dynamic parameter of the battery.

170. The method of claim 169 wherein the dynamic parameter is measured through a Kelvin a connection electrically coupled to the battery.

171. The method of claim 169 including applying a time varying signal to the battery and wherein the dynamic parameter is a function of the time varying signal.

172. The method of claim 14 including sensing electrical current through the battery and wherein state of charge is a function of the sensed electrical current.

173. The method of claim 14 including determining a likelihood that the vehicle will start.

174. The method claim 173 wherein determining the likelihood that the vehicle will start is a function of a determined state of health and determined state of charge of the battery and stored starting performance data.

175. The method of claim 14 including determining whether the battery has been replaced.

176. The method of claim 14 including coupling to an internal databus of the vehicle.

177. The method of claim 169 wherein the dynamic parameter is selected from the group of dynamic parameter consisting of dynamic resistance, dynamic conductance, dynamic admittance, dynamic impedance and their combinations.

178. The method of claim 169 wherein determining state of charge of the battery is based upon a characterization curve which provides a functional relationship between the dynamic parameter and battery state of charge.

179. The method of claim 169 wherein the dynamic parameter is a function of synchronized voltage and current measurements.

180. The method of claim 14 including detecting a failure of a voltage regulator of the vehicle based upon a measured voltage.

181. The method of claim 14 including detecting a failure of an alternator of the vehicle based upon a measured voltage.

182. The method of claim 14 including measuring battery temperature and wherein battery state of charge is a function of measured battery temperature.

183. The method of claim 169 wherein determining a condition of the battery is a function of averaged dynamic measurements from the battery.

184. The method of claim 183 wherein the dynamic measurements are obtained through an analog to digital converter having a dynamic range substantially equal to a range of the signals being sampled.

185. The method of claim 14 wherein determining state of charge is based upon a parameter selected from the group of parameters consisting of battery state of health, battery temperature, battery charge balance, battery charging efficiency and initial battery conditions.

186. The method of claim 1 wherein determining a battery state of charge is based upon artificial intelligence techniques.

187. The method of claim 171 wherein the time varying signal comprises a forcing function applied by selectively coupling a resistive load to the battery.

188. The method of claim 169 wherein the dynamic parameter of the battery is a function of a voltage change.

189. The method of claim 169 wherein the dynamic parameter of the battery is a function of change in total current flowing through the battery.

190. The method of claim 14 including providing a "service battery soon" output based upon battery condition.

191. The method of claim 14 including diagnosing battery condition.

192. The method of claim 169 wherein determining battery state of charge includes applying the dynamic parameter to a neural network.

193. The method of claim 171 wherein the forcing function comprises a square wave.

194. The method of claim 14 wherein determining a condition of the battery comprises determining battery state of charge as a function of battery state of health and battery temperature.

195. The method of claim 194 wherein the state of charge is a function of current flowing into or out of the battery.

196. The method of claim 14 including predicting an ability of the battery to start an engine of the vehicle.

197. The method of claim 196 including monitoring starting performance of the battery and wherein the predicting is based upon the monitored starter performance.

198. The method of claim 14 wherein controlling a performance parameter comprises controlling an idle speed of an engine of the vehicle which is coupled to the alternator.

199. The method of claim 14 wherein controlling a performance parameter comprises controlling shift points of a transmission coupled to an engine.

200. The method of claim 14 wherein controlling electrical loads of the vehicle applied to the battery.

201. The method of claim 14 wherein controlling the vehicle performance parameter is further based upon identification of a vehicle operator.

202. The method of claim 14 wherein controlling the vehicle performance parameter is further based upon identification of a driving pattern.

203. The method of claim 14 including reducing the charge signal when the determined state of charge indicates that the battery is fully charged.

204. The method of claim 14 including monitoring multiple phases produced by an alternator and responsively diagnosing alternator condition.

205. The method of claim 14 including outputting diagnostic information on a databus of the vehicle.

206. The method of claim 14 including providing a warranty code output.

207. Computer software configured to implement the method of claim 14.

208. A battery charging controller which operates in accordance with the method of claim 14.

209. The method of claim 15 wherein the battery performance parameter comprises voltage.

210. The method of claim 15 wherein the battery performance parameter is a function of a dynamic parameter.

211. The method of claim 15 wherein the battery performance parameter is measured through Kelvin connections electrically coupled to the battery.

212. The method of claim 15 wherein the battery performance parameter comprises state of charge.

213. The method of claim 15 wherein the battery performance parameter comprises state of health.

214. The method of claim 15 including transmitting data on a databus of the vehicle which indicates the installed battery has been replaced.

215. The method of claim 15 including generating a warranty code related to replacement of the installed battery.

216. Computer software configured to implement the method of claim 15.

217. A battery monitor configured to implement the method of claim 15.

218. The method of claim 16 including sensing electrical current through the battery and wherein controlling the charge signal is further in response to the sensed electrical current.

219. The method of claim 16 including determining whether the battery has been replaced.

220. The method of claim 16 including applying a forcing function to the battery and wherein measuring a dynamic parameter of the battery is a function of the applied forcing function.

221. The method of claim 16 including providing a user input/output.

222. The method of claim 16 including measuring a voltage drop across a current shunt placed in series with the battery.

223. The method of claim 16 wherein the dynamic parameter is selected from the group of dynamic parameter consisting of dynamic resistance, dynamic conductance, dynamic admittance, dynamic impedance and their combinations.

224. The method of claim 16 wherein determining a condition of the battery is based upon a characterization curve which provides a functional relationship between the dynamic parameter and battery condition.

225. The method of claim 16 wherein determining a condition of the battery is adjusted based upon a parameter of the battery.

226. The method of claim 16 wherein the measured dynamic parameter is a function of synchronized voltage and current measurements.

227. The method of claim 16 including detecting a failure of a voltage regulator.

228. The method of claim 16 including measuring battery temperature and determining a condition of the battery is a function of measured battery temperature.

229. The method of claim 16 wherein determining a condition of the battery is a function of Cold Cranking Amps (CCA) capacity of the battery.

230. The method of claim 16 wherein determining a condition of the battery is a function of averaged dynamic measurements from the battery.

231. The method of claim 230 wherein data samples are obtained through an analog to digital converter having a dynamic range substantially equal to a dynamic range of the samples.

232. The method of claim 16 including providing an output if battery capacity is less than a threshold level.

233. The method of claim 16 including determining state of charge based upon a parameter selected from the group of parameters consisting of battery state of health, of battery temperature, of battery charge balance, battery charging efficiency and initial battery conditions.

234. The method of claim 16 wherein determining a condition of the battery is based upon artificial intelligence techniques.

235. The method of claim 16 wherein the time varying signal comprises a forcing function applied by selectively coupling a resistive load to the battery.

236. The method of claim 16 wherein the dynamic parameter of the battery is a function of voltage change.

237. The method of claim 16 wherein the dynamic parameter of the battery is a function of change in total current flowing through the battery.

238. The method of claim 16 including providing a "service battery soon" output based upon battery condition.

239. The method of claim 16 including diagnosing battery condition.

240. The method of claim 239 wherein diagnosing battery condition is a function of if-then rules.

241. The method of claim 239 wherein diagnosing battery condition is a function of comparison to a threshold.

242. The method of claim 16 wherein determining a battery condition includes applying the dynamic parameter to a neural network.

243. The method of claim 242 including training the neural network.

244. The method of claim 235 wherein the forcing function comprises a square wave.

245. The method of claim 16 wherein determining a condition of the battery comprises determining battery state of charge as a function of battery state of health and battery temperature.

246. The method of claim 245 wherein the state of charge is a function of current flowing into or out of the battery.

247. The method of claim 16 including controlling the charge signal based upon electrical loads applied to the battery.

248. The method of claim 16 including reducing the charge signal when the determined condition indicates that the battery is fully charged.

249. The method of claim 16 including monitoring multiple phases of the charge signal and responsively diagnosing a charge signal condition.

250. The method of claim 16 including outputting diagnostic information on a databus.

251. The method of claim 16 including outputting diagnostic information over a non-physical connection.

252. The method of claim 16 including outputting diagnostic information in the form of a web page.

253. The method of claim 1 wherein the standby power system 16 includes a internet protocol address.

254. The method of claim 16 including providing a warranty code output.

255. The method of claim 16 including automatically calibrating the measured dynamic parameter.

256. The method of claim 16 including entering a sleep mode during periods of inactivity.

257. The method of claim 16 including identifying a loose or corroded connection to the battery.

258. The method of claim 16 wherein a Kelvin connection is "split".

259. Computer software configured to implement the method of claim 17.

260. A battery charger in a standby power system configured to which operates in accordance with claim 16.

261. The apparatus of claim 20 wherein the microprocessor is further configured to determine whether the battery has been replaced.

262. The apparatus of claim 20 wherein the microprocessor couples to an internal databus of the vehicle.

263. The apparatus of claim 20 including a forcing function applying to the battery and wherein the dynamic parameter of the battery is a function of the applied forcing function.

264. The apparatus of claim 20 including a user input/output.

265. The apparatus of claim 20 wherein the current sensor comprises a voltmeter configured to measure voltage across a current shunt placed in series with the battery.

266. The apparatus of claim 20 wherein the dynamic parameter is selected from the group of dynamic parameter consisting of dynamic resistance, dynamic conductance, dynamic admittance, dynamic impedance and their combinations.

267. The apparatus of claim 20 wherein the condition of the battery is based upon a characterization curve which provides a functional relationship between the dynamic parameter and battery condition.

268. The apparatus of claim 20 wherein the condition of the battery is adjusted based upon a parameter of the battery.

269. The apparatus of claim 20 wherein the measured dynamic parameter is a function of synchronized voltage and current measurements.

270. The apparatus of claim 20 wherein the microprocessor detects a failure of a voltage regulator based upon a measured voltage.

271. The apparatus of claim 20 including a battery temperature sensor and wherein the condition of the battery is a function of measured battery temperature.

272. The apparatus of claim 20 wherein determining a condition of the battery is a function of Cold Cranking Amps (CCA) capacity of the battery.

273. The apparatus of claim 20 wherein determining a condition of the battery is a function of averaged dynamic measurements from the battery.

274. The apparatus of claim 20 including an analog to digital converter configured to provide data samples which has a dynamic range substantially equal to a range of the samples.

275. The apparatus of claim 20 including an output indicative of a battery capacity less than a threshold level.

276. The apparatus of claim 20 wherein the microprocessor determines a state of charge based upon a parameter selected from the group of parameters consisting of battery state of health, of battery temperature, of battery charge balance, battery charging efficiency and initial battery conditions.

277. The apparatus of claim 20 wherein the microprocessor determines a condition of the battery based upon artificial intelligence techniques.

278. The apparatus of claim 20 wherein the dynamic parameter of the battery is a function Of voltage change.

279. The apparatus of claim 20 wherein the dynamic parameter of the battery is a function of change in total current flowing through the battery.

280. The apparatus of claim 20 including providing a "service battery soon" output based upon battery condition.

281. The apparatus of claim 20 wherein diagnosing battery condition is a function of if-then rules.

282. The apparatus of claim 20 wherein battery condition is a function of comparison to a threshold.

283. The apparatus of claim 20 wherein the microprocessor determines a battery condition by application of the dynamic parameter to a neural network.

284. The apparatus of claim 283 wherein the microprocessor is configured to implement training of the neural network.

285. The apparatus of claim 5 wherein the forcing function comprises a square wave.

286. The apparatus of claim 5 wherein the condition of the battery is a function of battery state of charge which is determined as a function of battery state of health and battery temperature.

287. The apparatus of claim 286 wherein the state of charge is a function of current flowing into or out of the battery.

288. The apparatus of claim 21 wherein the microprocessor controls the charge signal based upon electrical loads applied to the battery.

289. The apparatus of claim 21 wherein the microprocessor controls the charge signal based upon identification of a driving pattern.

290. The apparatus of claim 20 wherein the microprocessor outputs diagnostic information on a databus of the vehicle.

291. The apparatus of claim 20 wherein the microprocessor outputs diagnostic information over a non-physical connection.

292. The apparatus of claim 20 wherein the microprocessor outputs diagnostic information in the form of a web page.

293. The apparatus of claim 20 wherein the standby power system 20 includes a internet protocol address.

294. The apparatus of claim 20 wherein the microprocessor provides a warranty code output.

295. The apparatus of claim 20 wherein the microprocessor automatically calibrates the measured dynamic parameter.

296. The apparatus of claim 20 wherein the microprocessor identifies a loose or corroded connection to the battery.

297. The apparatus of claim 21 wherein a Kelvin connection formed by the electrical connections is "split".

298. The method of claim 14 including providing a user input/output.

299. The method of claim 14 including measuring a voltage drop across a current shunt placed in series with the battery and wherein the state of charge is a function of the voltage drop.

* * * * *

UNITED STATES PATENT AND TRADEMARK OFFICE
CERTIFICATE OF CORRECTION

PATENT NO. : 6,331,762 B1
DATED : December 18, 2001
INVENTOR(S) : Kevin I. Bertness It is certified that error appears in the above-identified patent and that said Letters Patent is hereby corrected as shown below:

Column 14,
Line 57, after "battery" insert -- , --.

Column 19,
Line 9, change "a" to -- an --.
Line 59, change "a nd" to -- and --.

Column 20,
Line 14, change "samples" to -- sample --.

Column 21,
Line 34, change "a" to -- an --.

Column 24,
Line 14, after "wherein" insert -- controlling the vehicle performance parameter comprises --.

Column 26,
Line 19, change "a" to -- an --.
Line 33, delete "to".
Line 40, change "applying" to -- applied --.

Column 27,
Line 23, change "Of" to -- of --.

Column 28,
Line 23, change "a" to -- an --.

Signed and Sealed this

Tenth Day of September, 2002

Attest:

JAMES E. ROGAN
*Attesting Officer*    *Director of the United States Patent and Trademark Office*